(12) United States Patent
Qiu et al.

(10) Patent No.: US 12,284,892 B2
(45) Date of Patent: Apr. 22, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanyou Qiu, Beijing (CN); Weiyun Huang, Beijing (CN); Yao Huang, Beijing (CN); Yue Long, Beijing (CN); Tianyi Cheng, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/396,840

(22) Filed: Dec. 27, 2023

(65) Prior Publication Data

US 2024/0138214 A1 Apr. 25, 2024

Related U.S. Application Data

(63) Continuation of application No. 17/428,847, filed as application No. PCT/CN2021/073243 on Jan. 22, 2021, now Pat. No. 11,980,071.

(30) Foreign Application Priority Data

Jan. 23, 2020 (WO) ................ PCT/CN2020/073993
Jan. 23, 2020 (WO) ................ PCT/CN2020/073995
(Continued)

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 59/126* (2023.02);
(Continued)

(58) Field of Classification Search
None
See application file for complete search history.

(56) References Cited

U.S. PATENT DOCUMENTS 10,756,136 B1  8/2020  Ma et al.
10,903,291 B2  1/2021  Ding et al.
(Continued)

FOREIGN PATENT DOCUMENTS

CN  104599634 A  5/2015
CN  107591125 A  1/2018
(Continued)

OTHER PUBLICATIONS

Non-final Office Action in the related application U.S. Appl. No. 17/288,823, dated Jan. 26, 2024.
(Continued)

*Primary Examiner* — Jack S Chen
(74) *Attorney, Agent, or Firm* — Chiwin Law LLC

(57) ABSTRACT

A display substrate and a display device. The display substrate includes a display region, a first connecting wire and a second connecting wire. The display region includes a first display region and a second display region. The first display region includes a plurality of light emitting devices arranged in an array, and the plurality of light emitting devices includes a first light emitting device and a second light emitting device. The second display region includes a plurality of first pixel circuit units, and the plurality of pixel circuit units includes a first pixel circuit and a second pixel circuit. The first connecting wire is connected to the first pixel circuit and the first light emitting device. The second
(Continued)

connecting wire is connected to the second pixel circuit and the second light emitting device. The first direction and the second direction intersect each other.

19 Claims, 11 Drawing Sheets

(30) Foreign Application Priority Data

| | | |
|---|---|---|
| Jan. 23, 2020 | (WO) | PCT/CN2020/073996 |
| Jan. 23, 2020 | (WO) | PCT/CN2020/074001 |
| Feb. 28, 2020 | (CN) | 202010130251.7 |

(51) Int. Cl.
  *H10K 59/126* (2023.01)
  *H10K 59/35* (2023.01)
  *H10K 59/88* (2023.01)

(52) U.S. Cl.
  CPC ... *H10K 59/353* (2023.02); *G09G 2300/0413* (2013.01); *G09G 2300/0426* (2013.01); *G09G 2300/0452* (2013.01); *G09G 2300/0842* (2013.01); *H10K 59/88* (2023.02)

(56) References Cited

U.S. PATENT DOCUMENTS

| | | | |
|---|---|---|---|
| 11,980,071 | B2 * | 5/2024 | Qiu ............ H10K 59/353 |
| 2002/0121639 | A1 | 9/2002 | So et al. |
| 2011/0193855 | A1 | 8/2011 | Han |
| 2013/0087770 | A1 | 4/2013 | Son et al. |
| 2013/0207099 | A1 | 8/2013 | Shu et al. |
| 2018/0089485 | A1 | 3/2018 | Bok |
| 2018/0151641 | A1 | 5/2018 | Choo et al. |
| 2019/0123066 | A1 | 4/2019 | Zhan et al. |
| 2019/0157375 | A1 | 5/2019 | Liang et al. |
| 2019/0180686 | A1 | 6/2019 | Qu et al. |
| 2019/0393286 | A1 | 12/2019 | Ding et al. |
| 2020/0176696 | A1 | 6/2020 | Dai et al. |
| 2021/0327958 | A1 | 10/2021 | Li et al. |
| 2022/0123094 | A1 | 4/2022 | Qiu et al. |
| 2022/0209148 | A1 | 6/2022 | Park et al. |

FOREIGN PATENT DOCUMENTS

| | | | |
|---|---|---|---|
| CN | 107610635 | A | 1/2018 |
| CN | 108039149 | A | 5/2018 |
| CN | 108364957 | A | 8/2018 |
| CN | 108376696 | A | 8/2018 |
| CN | 109064904 | A | 12/2018 |
| CN | 109272873 | A | 1/2019 |
| CN | 109585519 | A | 4/2019 |
| CN | 109981855 | A | 7/2019 |
| CN | 110047846 | A | 7/2019 |
| CN | 110060578 | A | 7/2019 |
| CN | 110061014 | A | 7/2019 |
| CN | 110061038 | A | 7/2019 |
| CN | 110148621 | A | 8/2019 |
| CN | 110189639 | A | 8/2019 |
| CN | 110232892 | A | 9/2019 |
| CN | 110415650 | A | 11/2019 |
| CN | 110491918 | A | 11/2019 |
| CN | 110492018 | A | 11/2019 |
| CN | 110504289 | A | 11/2019 |
| CN | 209787228 | U | 12/2019 |
| CN | 110675744 | A | 1/2020 |
| CN | 110716677 | A | 1/2020 |
| CN | 209947878 | U | 1/2020 |
| CN | 111326560 | A | 6/2020 |
| JP | 2010230797 | A | 10/2010 |
| JP | 2015156270 | A | 8/2015 |
| JP | 2018085114 | A | 5/2018 |
| JP | 2019148737 | A | 9/2019 |
| WO | 2012101397 | A2 | 8/2018 |

OTHER PUBLICATIONS

First Office Action in the related JP2022-502521, dated Feb. 13, 2024 (as corrected).
First Office Action in the related JP2018085114A, dated Feb. 13, 2024.
Second Office Action issued in the related JP2022-502521, dated Jun. 10, 2024.
Supplement European Search Report of corresponding U.S. Appl. No. 17/428,847-EESR, dated Jan. 3, 2023, disclosed in parent U.S. Appl. No. 17/428,847.
Non-final Office Action issued in a related U.S. Appl. No. 17/428,847, dated Mar. 2, 2023, disclosed in parent U.S. Appl. No. 17/428,847.
Second Office Action in the corresponding Chinese Patent Application No. 202080000101.2 with Search Report, disclosed in parent U.S. Appl. No. 17/428,847.
First Office Action issued in a related application of CN202080000249.6, dated May 19, 2023, with search report, disclosed in parent U.S. Appl. No. 17/428,847.
International Search Report & Written of a related PCT/CN2020/073993, Oct. 29, 2020, CN & EN.
International Search Report & Written of a related PCT/CN2020/073995, Oct. 16, 2020, CN & EN.
International Search Report & Written of a related PCT/CN2020/073996, Oct. 27, 2020, CN & EN.
International Search Report & Written of a related PCT/CN2020/080182, Oct. 28, 2020, CN & EN.
International Search Report & Written of the corresponding PCT/CN2021/073243, Mar. 30, 2021, CN & EN.
Notice of Allowance (NOA) of the parent U.S. Appl. No. 17/428,847, dated Nov. 9, 2023.

* cited by examiner

DISPLAY SUBSTRATE AND DISPLAY DEVICE

CROSS REFERENCE TO RELATED APPLICATIONS

The present application is a continuation of U.S. Ser. No. 17/428,847 filed on Aug. 5, 2021, which claims priority to the PCT Patent Applications No. PCT/CN2020/073993, No. PCT/CN2020/073995, No. PCT/CN2020/073996 and No. PCT/CN2020/074001, filed on Jan. 23, 2020, and the Chinese Patent Application No. 202010130251.7, filed on Feb. 28, 2020, for all purposes, the entire disclosure of the aforementioned application is incorporated by reference as part of the disclosure of the present application.

TECHNICAL FIELD

Embodiments of the present disclosure relate to a display substrate and a display device.

BACKGROUND

At present, the display screens used in electronic devices are developing towards larger screens and full screens, so as to enable users to have a better visual experience. Taking electronic products such as mobile phones and tablet computers as examples, these electronic devices need to incorporate components such as cameras and light sensors, and these components usually occupy display region of the display screen, which makes it difficult for the display screen to achieve a full-screen design. In order to ensure the light transmittance of the region where the camera is located in the display screen and ensure the photographing effect of the camera, only light emitting elements of pixel circuits are reserved in the region where the camera is located.

SUMMARY

At least one embodiment of the present disclosure provides a display substrate, including a display region, a first connection line and a second connection line. The display region includes a first display region and a second display region at least partially surrounding the first display region. The first display region includes a first sub-pixel array, the first sub-pixel array includes a plurality of light emitting elements arranged in an array, the plurality of light emitting elements include a first light emitting element and a second light emitting element. The second display region includes a first pixel circuit array, the first pixel circuit array includes a plurality of first pixel circuit units, and the plurality of first pixel circuit units include a first pixel circuit and a second pixel circuit. The first connection line connects the first pixel circuit and the first light emitting element, and the first pixel circuit is configured to drive the first light emitting element through the first connection line. The second connection line connects the second pixel circuit and the second light emitting element, and the second pixel circuit is configured to drive the second light emitting element through the second connection line. The second connection line extends in a first direction, the first connection line extends in a second direction, and the first direction and the second direction cross each other.

For example, the display substrate according to an embodiment of the present disclosure further includes: a first signal line and a second signal line, the first signal line includes a first main portion and a first winding portion, the first main portion extends in the first direction, and at least part of the first winding portion extends in a direction crossing the first direction; the second signal line includes a second main portion, and the second main portion extends in the second direction; the first winding portion of the first signal line and the second main portion of the second signal line are electrically connected to the first pixel circuit, so as to respectively provide a first driving signal and a second drive signal to the first pixel circuit; and an extension line of the first main portion and an extension line of the second main portion intersect in the first display region.

For example, in the display substrate provided by an embodiment of the present disclosure, the first winding portion includes a first sub-winding portion, a second sub-winding portion, and a third sub-winding portion, the first sub-winding portion extends in the second direction, the second sub-winding portion extends in the first direction, and the third sub-winding portion connects the first sub-winding portion and the first main portion, the first sub-winding portion is electrically connected to the second sub-winding portion and the third sub-winding portion by a wire jumper method, and the second sub-winding portion is electrically connected to the first pixel circuit.

For example, in the display substrate provided by an embodiment of the present disclosure, the third sub-winding portion at least partially surrounds the first display region, and the third sub-winding portion overlaps with the first connection line.

For example, in the display substrate provided by an embodiment of the present disclosure, the first main portion and at least part of the first winding portion are disposed in different wiring layers.

For example, in the display substrate provided by an embodiment of the present disclosure, the second signal line further includes a second winding portion, and at least part of the second winding portion extends in a direction crossing the second direction.

For example, in the display substrate provided by an embodiment of the present disclosure, the second main portion and at least part of the second winding portion are disposed in different wiring layers.

For example, the display substrate provided by an embodiment of the present disclosure further includes: a third signal line, the third signal line includes a third main portion and a third winding portion, the third main portion extends in the first direction, and at least part of the third winding portion extends in the direction crossing the first direction; and the third winding portion of the third signal line and the second winding portion of the second signal line are electrically connected to the second pixel circuit, so as to respectively provide a third drive signal and the second drive signal for the second pixel circuit.

For example, in the display substrate provided by an embodiment of the present disclosure, the third winding portion includes a fourth sub-winding portion, a fifth-sub winding portion, and a sixth sub-winding portion, the fourth sub-winding portion extends in the second direction, and the fifth sub-winding portion extends in the first direction, the sixth sub-winding portion connects the fourth sub-winding portion and the third main portion, the fourth sub-winding portion is electrically connected to the fifth sub-winding portion and the sixth sub-winding portion by a wire jumper method, and the fifth sub-winding portion is electrically connected to the second pixel circuit.

For example, in the display substrate provided by an embodiment of the present disclosure, the first signal line and the third signal line are data lines, the first driving signal and the third driving signal are data signals, the second signal line is a gate line, and the second driving signal is a gate scan signal.

For example, in the display substrate provided by an embodiment of the present disclosure, the first connection line and the second connection line are transparent lines.

For example, in the display substrate provided by an embodiment of the present disclosure, the first winding portion of the first signal line and the third winding portion of the third signal line are routed around an edge of the first display region at a boundary between the first pixel circuit array of the second display region and the first sub-pixel array of the first display region.

For example, in the display substrate provided by an embodiment of the present disclosure, the second display region further includes a second sub-pixel array, the second sub-pixel array includes a plurality of first pixel units, and the plurality of first pixel units and the plurality of first pixel circuit units are alternately arranged.

For example, in the display substrate provided by an embodiment of the present disclosure, each of the plurality of first pixel units includes a third light emitting element and a third pixel circuit, and the third pixel circuit is electrically connected to the third light emitting element so as to drive the third light emitting element.

For example, in the display substrate provided by an embodiment of the present disclosure, the display region further includes a third display region, the third display region includes a third sub-pixel array, and the third sub-pixel array includes a plurality of second pixel units, each of the plurality of second pixel units includes a fourth light emitting element and a fourth pixel circuit, the first main portion of the first signal line extends in the third display region to be electrically connected to the fourth pixel circuit located in the first direction with respect to the first light emitting element, and the third main portion of the third signal line extends in the third display region to be electrically connected to the fourth pixel circuit located in the first direction with respect to the second light emitting element.

For example, in the display substrate provided by an embodiment of the present disclosure, the fourth pixel circuit is electrically connected to the fourth light emitting element so as to drive the fourth light emitting element.

For example, in the display substrate provided by an embodiment of the present disclosure, the first pixel circuit and the second pixel circuit respectively include a thin film transistor and a storage capacitance, the thin film transistor includes an active layer, a gate electrode, a first gate insulating layer, a second gate insulating layer, an interlayer insulating layer, and source and drain electrodes, and the storage capacitance includes a first capacitance plate and a second capacitance plate; the active layer is disposed on the base substrate, the first gate insulating layer is disposed on a side of the active layer away from the base substrate, and the gate electrode and the first capacitance plate are disposed in a same layer on a side of the first gate insulating layer away from the base substrate, and the second gate insulating layer is disposed on a side of the gate electrode away from the base substrate and a side of the first capacitance plate away from the base substrate, the second capacitance plate is disposed on a side of the second gate insulating layer away from the base substrate, and the interlayer insulating layer is disposed on a side of the second capacitance plate away from the base substrate, the source and drain electrodes are disposed on a side of the interlayer insulating layer away from the base substrate, and the source and drain electrodes are electrically connected to the active layer through via holes in the first gate insulating layer, the second gate insulating layer, and the interlayer insulating layer, the display substrate further includes a first planarization layer disposed on a side of the source and drain electrodes away from the base substrate to provide a first planarization surface, the first planarization layer includes first via holes, the second signal line is disposed in a same layer as the gate electrode and the first capacitance plate, the first signal line and the third signal line are disposed in a same layer as the source and drain electrodes.

For example, in the display substrate provided by an embodiment of the present disclosure, the first connection line and the second connection line respectively include a light transmitting wiring layer, and the light transmitting wiring layer is on the first planarization surface and located in the first display region and the second display region, the light transmitting wiring layer is electrically connected to the thin film transistor through the first via holes of the first planarization layer in the second display region, the display substrate further includes a second planarization layer disposed on a side of the light transmitting wiring layer away from the base substrate to provide a second planarization surface, and the second planarization layer includes second via holes located in the first display region, the first light emitting element in the first display region and the second light emitting element in the first display region are on the second planarization surface and are electrically connected to the light transmitting wiring layer in the first display region through the second via holes.

At least one embodiment of the present disclosure further provides a display device, including any one of the above-mentioned display substrate.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. For the convenience of description, in some drawings, "up", "down", "front", and "back" are given. In the embodiments of the present disclosure, the vertical direction is a direction from top to bottom, and the vertical direction is the direction of gravity, the horizontal direction is a direction perpendicular to the vertical direction, and the horizontal direction is a direction from right to left or a direction from front to back.

According to some embodiments, a part of the display region used to install sensors (such as image sensor, infrared sensor, and distance sensor) and other components can be designed as a light transmitting display region, so that the light transmitting display region can achieve display function and provide convenience for the installation of the sensors and other components. Therefore, these sensors can achieve imaging, infrared sensing, distance sensing and other functions through the light transmitting display region without affecting the display function of the light transmitting display region, which helps to enable electronic device to achieve full-screen display.

Figure 1A:
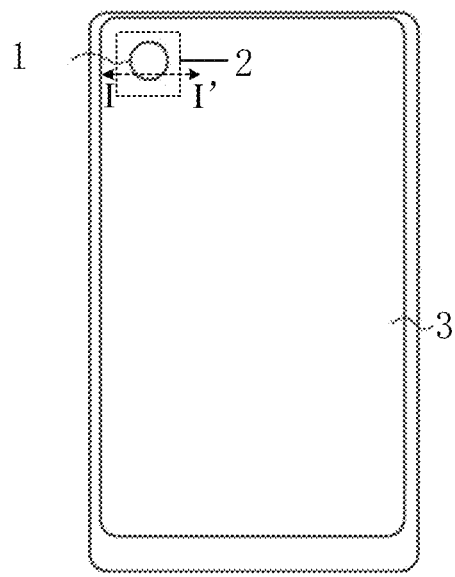
FIG. 1A is a schematic plan view of a display substrate.
Figure 1B:
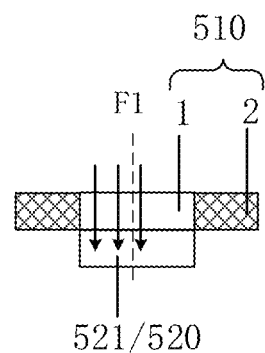
FIG. 1B is a schematic cross-sectional view taken along the line I-I' in FIG. 1A.
Figure 2:
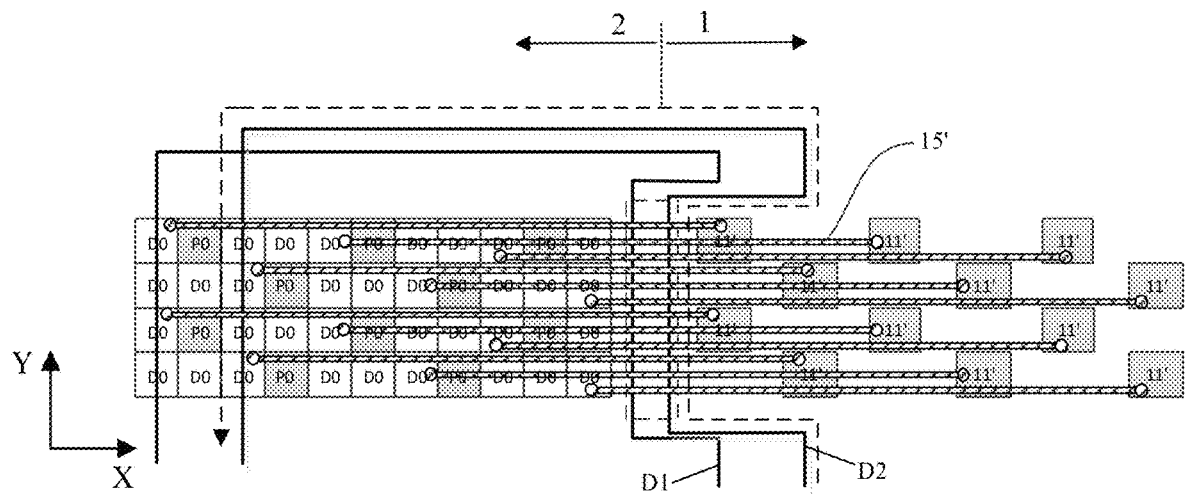
FIG. 2 is a schematic plan view of a wiring arrangement in a display region of the display substrate shown in FIG. 1A.

For example, FIG. 1A is a schematic plan view of a display substrate; FIG. 1B is a schematic cross-sectional view taken along the line I-I' in FIG. 1A; FIG. 2 is a schematic plan view of a wiring arrangement in a display region of the display substrate shown in FIG. 1A.

As shown in FIG. 1A and FIG. 2, the display region of the display substrate includes a light transmitting display region 1, a peripheral display region 2 and a main display region 3. The peripheral display region 2 at least partially surrounds the light transmitting display region 1, and the main display region 3 at least partially surrounds the light transmitting display region 1 and the peripheral display region 2. As shown in the figures, the light transmitting display region 1, the peripheral display region 2 and the main display region 3 form a rectangular display region as a whole to display complete (rectangular) pictures.

As shown in FIG. 1B, the display substrate includes a sensing layer 520 and a display structure layer 510 for achieving a display region. Correspondingly, the display structure layer 510 also includes a light transmitting display region 1 and a peripheral display region 2. The sensing layer 520 is disposed on a non-display side of the display substrate (that is, the side facing away from the user). The sensing layer 520 includes a sensor 521 that at least partially overlaps with the light transmitting display region 1 in the normal direction F1 of the display surface of the display substrate, and the sensor 521 is configured to receive and process light signals passing through the light transmitting display region 1.

For example, the main display region 3 is the major display region (or called the conventional display region), which has a higher resolution (PPI, Pixel Per Inch) than the light transmitting display region 1 and the peripheral display region 2, that is, a plurality of sub-pixels for display with higher density are arranged in the main display region 3. In the main display region 3, each sub-pixel includes a light emitting element and a pixel circuit for driving the light emitting element.

For example, the light transmitting display region 1 and the peripheral display region 2 also include a plurality of sub-pixels for display operation. For example, the resolution of the light transmitting display region 1 and the resolution of the peripheral display region 2 are the same.

The light transmitting display region 1 may allow light incident from the display side of the display substrate to pass through the display substrate to reach the back side of the display substrate, so that the light can be used for normal operation of components such as the sensor 521 located on the back side of the display substrate. However, because the pixel circuit of the sub-pixel is usually opaque, in order to improve the light transmittance of the light transmitting display region 1, the light emitting elements of the sub-pixels in the light transmitting display region 1 are physically separated from the pixel circuits driving the light emitting elements.

As shown in FIG. 2, a sub-pixel in the light transmitting display region 1 includes a light emitting element 11' located in the light transmitting display region 1 and a pixel circuit D0 located in the peripheral display region 2. The light emitting element 11' (for example, shown by the gray square in the light transmitting display region 1 in FIG. 2) of the sub-pixel in the light transmitting display region 1 is still kept in the predetermined location in the light transmitting display region 1, thereby achieving the display function of the light transmitting display region 1. However, the pixel circuit DO connected to the light emitting element 11' and used for driving the light emitting element 11' is removed from the light transmitting display region 1 to be disposed in the peripheral display region 2, as shown by the white square in the peripheral display region 2. Therefore, these pixel circuits DO occupy part of the space of the peripheral display region 2, and the rest space of the peripheral display region 2 is used to set sub-pixels P0 of the peripheral display region 2 (for example, shown by the gray square in the peripheral display region 2 in FIG. 2), that is, the sub-pixels that achieve display function of the peripheral display region 2.

For example, the sub-pixels P0 of the peripheral display region 2 (shown by the gray squares in FIG. 2) and the pixel circuits DO of the sub-pixels in the light transmitting display region 1 (shown by white squares in FIG. 2) are arranged in an array in the peripheral display region 2, as described above, the resolution of the light transmitting display region 1 and the resolution of the peripheral display region 2 are the same. For example, the resolution of the light transmitting display region 1 and the resolution of the peripheral display region 2 may be set to be lower than the resolution of the main display region 3, that is, the density of sub-pixels for display arranged in the light transmitting display region 1 and the density of sub-pixels for display arranged in the peripheral display region 2 are smaller than the density of sub-pixels arranged in the main display region 3.

For example, as shown in FIG. 2, the light emitting element 11' of the sub-pixel in the light transmitting display region 1 is electrically connected to the pixel circuit DO in the peripheral display region 2 located in the same line through a connection line 15', and the connection line 15' extends in a X direction, that is, arranged in the row direction. For example, at least part of the connection line 15' is transparent line so as to increase the light transmittance of the light transmitting display region 1, the material of the connection line 15' may include ITO (Indium Tin Oxide) transparent conductive material. The connection line 15' may extend across the sub-pixel P0 in the peripheral display region 2 to electrically connect the light emitting element 11' of the sub-pixel located in the light transmitting display region 1 and the pixel circuit DO located in the peripheral display region 2 that drives the light emitting element 11'.

Furthermore, as shown in FIG. 2, a data line D1 and a data line D2 are used to drive the pixel circuits DO of sub-pixels in the light transmitting display region 1, and the data line D1 and the data line D2 may be routed around the boundary of the peripheral display region 2 close to the light transmitting display region 1, thus the data line D1 and the data line D2 are electrically connected to the pixel circuits DO removed from the light transmitting display region 1 and located in the peripheral display region 2, to provide data signals required for display. In FIG. 2, a direction indicated by an arrow of a dotted line parallel to the data line D1 and the data line D2 indicates the direction of the data signal in the data line D1 and the data line D2. In this way, the pixel circuits of the sub-pixels located in a same column in the display region (including the main display region 3, the peripheral display region 2 and/or the light transmitting display region 1) can be electrically connected to a same data line, so that the pixel circuits of the sub-pixels located in the same column can be driven by the same data line, and the data driving circuit does not need to be changed or added. In FIG. 2, the data line D1 on the left is electrically connected to the pixel circuits of the first column of sub-pixels on the left in the light transmitting display region 1 by detouring, and the data line D2 on the right is electrically connected to the pixel circuits of the second column of sub-pixels on the left in the light transmitting display region 1 by detouring.

In the above situation, In the case that a plurality of connection lines 15' connected to a plurality of light emitting elements 11' located in a same row in the light transmitting display region 1 are all arranged side by side along the X direction, because the limitation of the size of each sub-pixel P0 in a Y direction perpendicular to the X direction (that is, the height of the sub-pixel P0 in the figure), the number of the connection lines 15' in the same row is limited. In this case, the number of the sub-pixels that can be arranged in the same row is limited. If the light transmitting display region is large and there are many sub-pixels in a row, limited to the number of the connection lines 15' for sub-pixels that can be set in the same row, the above layout may not meet the needs of large size cameras.

At least one embodiment of the present disclosure provides a display substrate. The display substrate includes a display region, a first connection line and a second connection line. The display region includes a first display region and a second display region at least partially surrounding the first display region. The first display region includes a first sub-pixel array, the first sub-pixel array includes a plurality of light emitting elements arranged in an array, the plurality of light emitting elements include a first light emitting element and a second light emitting element. The second display region includes a first pixel circuit array, the first pixel circuit array includes a plurality of first pixel circuit units, and the plurality of first pixel circuit units include a first pixel circuit and a second pixel circuit. The first connection line connects the first pixel circuit and the first light emitting element, and the first pixel circuit is configured to drive the first light emitting element through the first connection line. The second connection line connects the second pixel circuit and the second light emitting element, and the second pixel circuit is configured to drive the second light emitting element through the second connection line. The second connection line extends in a first direction, the first connection line extends in a second direction, and the first direction and the second direction cross each other.

In the display substrate provided by the above embodiment, the first pixel circuit is connected to the first light emitting element through the first connection line extending in the first direction, and the second pixel circuit is connected to the second light emitting element through the second connection line extending in the second direction, so that a plurality of light emitting elements in the first display region can be driven in the first direction and the second direction, so that the number of the light emitting elements in the first display region can be increased, and is no longer limited to the size of the sub-pixels in a certain direction, so the demand for large size cameras can be met.

Hereinafter, the embodiments and examples of the present disclosure will be described in detail with reference to the accompanying figures.

Figure 3A:
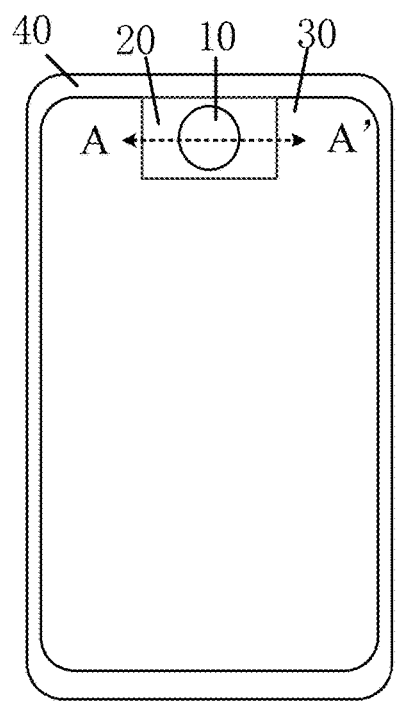
FIG. 3A is a schematic plan view of a display substrate provided by at least one embodiment of the present disclosure.
Figure 3B:
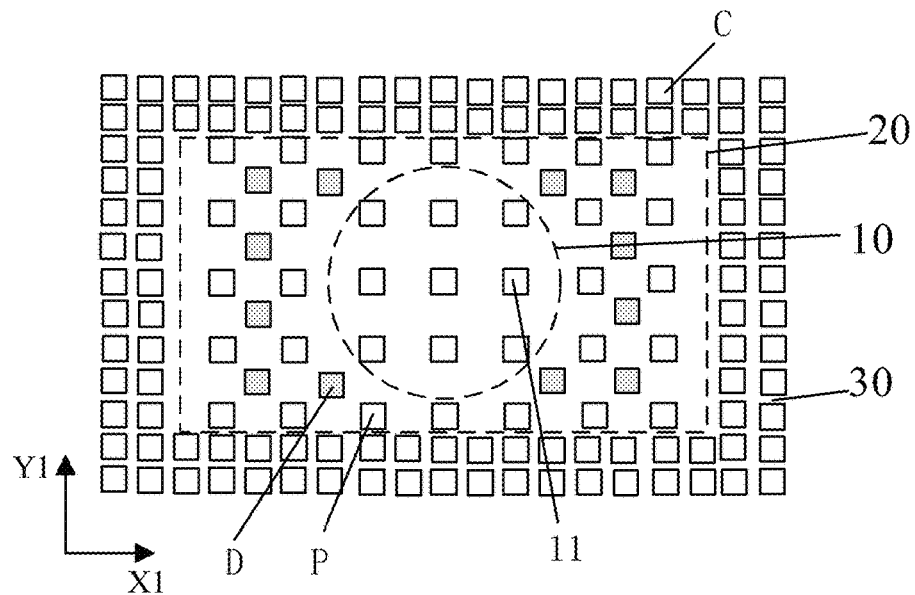
FIG. 3B is a partial enlarged schematic diagram of a display substrate provided by at least one embodiment of the present disclosure.

FIG. 3A is a schematic plan view of a display substrate provided by at least one embodiment of the present disclosure; FIG. 3B is a partial enlarged schematic diagram of a display substrate provided by at least one embodiment of the present disclosure.

As shown in FIG. 3A and FIG. 3B, the display substrate according to the embodiment of the present invention includes a display region and a peripheral region 40 surrounding the display region. The display region includes a first display region 10 and a second display region 20. The first display region 10 and the second display region 20 are arranged side by side and do not overlap each other, and the second display region 20 partially surrounds the first display region 10, for example. In FIG. 3B, the first display region 10 is identified by a dotted circle, and the second display region 20 is identified by a dotted square.

For example, the first display region 10 is a light transmitting display region, which allows incident light from the display side of the display substrate to pass through the region to reach the non-display side of the display substrate. As will be described later with reference to FIG. 7, the non-display side may be provided with a sensor to receive the transmitted light, so as to achieve corresponding functions (such as imaging, infrared sensing, distance sensing, etc.). The sensor is arranged at the non-display side of the display substrate, and at least partially overlaps the first display region 10 in the normal direction of the display surface of the display substrate, and is configured to receive and process light signals passing through the first display region 10.

As shown in FIG. 3B, the first display region 10 includes a first sub-pixel array (composed of white squares in a dotted circle in FIG. 3B), and the first sub-pixel array includes a plurality of light emitting elements 11 arranged in an array (the white squares in the dotted circle). The second display region 20 includes a first pixel circuit array (composed of gray squares in a dotted squares in FIG. 3B), and the first pixel circuit array includes a plurality of first pixel circuit units D (the gray squares in a dotted squares) for driving the plurality of light emitting elements 11 in the first display region 10 in a one-to-one correspondence. That is, the pixel circuits D of the first sub-pixel array in the first display region 10 is disposed in the second display region 20, and the pixel circuit and the light emitting element of each sub-pixel unit are separated from each other in location. The incident light from the display side can be transmitted through the blank region between adjacent light emitting elements to ensure the light transmittance of the first display region 10.

For example, the second display region 20 further includes a plurality of first pixel units P arranged in an array, and each first pixel unit P includes a third light emitting element and a third pixel circuit, and the third light emitting element and the third pixel circuit are directly connected to each other. The third light emitting element and the third pixel circuit are located in a same pixel region and are not separated from each other in location. For example, the array of the first pixel units P in the second display region 20 and the array of the pixel circuits D in the second display region 20 are interleaved with each other, so that the pixel circuits D are provided between adjacent first pixel units P, and the first pixel units P is provided between adjacent pixel circuits D.

For another example, the array of the first pixel units P in the second display region 20 and the array of the light emitting elements 11 in the first display region 10 are aligned with each other, thereby forming a new (complete) array including multiple rows and multiple columns, so that the first display region 10 and the second display region 20 have the same resolution.

Figure 4:
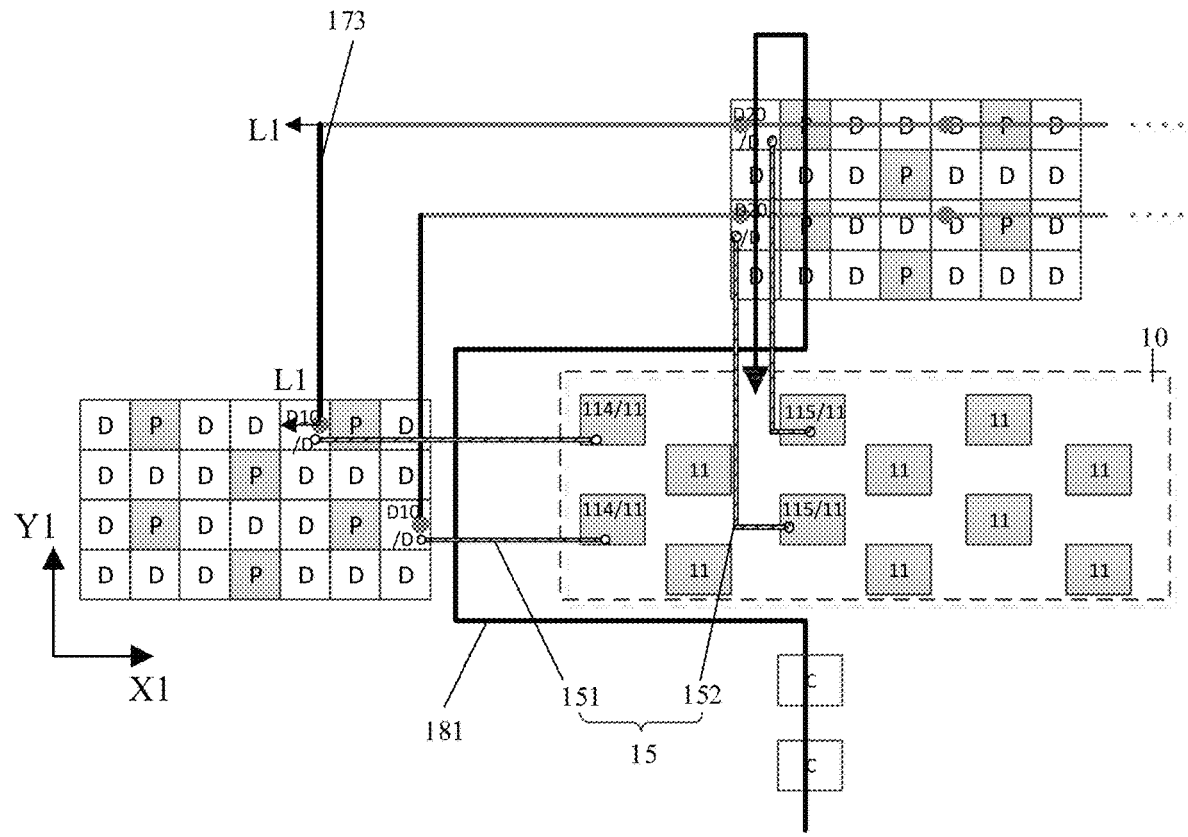
FIG. 4 is a schematic plan view of a wiring arrangement in a display region of a display substrate provided by at least one embodiment of the present disclosure.

For example, as shown in FIG. 4, the plurality of light emitting elements 11 in the first display region 10 include a first light emitting element 114 and a second light emitting element 115. Correspondingly, the plurality of first pixel circuit units D in the second display region 20 include a first pixel circuit D10 and a second pixel circuit D20, which are used to receive driving signals to respectively drive the first light emitting element 114 and the second light emitting element 115 to emit light.

In the situation shown in FIG. 4, the first pixel circuit D10 is in the second display region 20 and is located on the left side of the first display region 10, and the second pixel circuit D20 is in the second display region 20 and is located on the upper side of the first display region 10. The first light emitting element 114 and the first pixel circuit D10 are located in a same row, and the first light emitting element 114 and the first pixel circuit D10 are correspondingly connected along the second direction X1, thereby the first light emitting element 114 and the first pixel circuit D10 can functionally compose a sub-pixel in the first display region 10. The second light emitting element 115 and the second pixel circuit D20 are located in a same column, and the second light emitting element 115 and the second pixel circuit D20 are correspondingly connected along the first direction Y1, thereby the second light emitting element 115 and the second pixel circuit D20 can functionally compose a sub-pixel in the first display region 10.

For example, the first light emitting element 114 and the second light emitting element 115 are located in a same row in the first display region 10, and the first pixel circuit D10 and the second pixel circuit D20 are located in different rows in the second display region 20. The pixel circuits of different sub-pixels in a same row in the first display region 10 do not need to be arranged in a same row in the second display region 20.

For example, as shown in FIG. 4, the display substrate further includes a plurality of connection lines 15, and the plurality of connection lines 15 include a first connection line 151 and a second connection line 152. The first connection lines 151 extends in the second direction X1, and the second connection line 152 extends in the first direction Y1. The first connection line 151 and the second connection line 152 are both located in the first display region 10 and the second display region 20, that is, the first connection line 151 and the second connection line 152 both extend through the first display region 10 and the second display region 20.

As shown in FIG. 4, the first connection line 151 electrically connects the first pixel circuit D10 and the first light emitting element 114, and the first pixel circuit D10 is configured to drive the first light emitting element 114 to emit light through the first connection line 151. The second connection line 152 electrically connects the second pixel circuit D20 and the second light emitting element 115, and the second pixel circuit D20 is configured to drive the second light emitting element 115 to emit light through the second connection line 152.

For example, in some embodiments, the second direction X1 and the first direction Y1 cross each other. As shown in FIG. 4, the second direction X1 is, for example, the horizontal direction (row direction), and the first direction Y1 is, for example, the vertical direction (column direction), the second direction X1 is perpendicular to the first direction Y1. It should be noted that, the second direction X1 and the first direction Y1 may also cross each other but not perpendicular to each other. The embodiment shown in FIG. 4 is only an example, and the embodiment of the present disclosure is not limited thereto.

In the display substrate provided by the foregoing embodiment, the plurality of pixel circuits D can drive the plurality of light emitting elements 11 located in a same row (such as the first light emitting element 114 and the second light emitting element 115 located in the same row) in the first display region from two different directions (such as the second direction X1 and the first direction Y1) through the first connection line 151 and the second connection line 152, thereby the number of light emitting elements 11 in the same row in the first display region 10 can be increased, which can meet the needs of large size cameras.

For example, at least part of the first connection line 151 of the plurality of connection lines 15 (for example, at least a part in the first display region 10) is transparent line, and at least part of the second connection line 152 of the plurality of connection lines 15 (for example, at least a part in the first display region 10) is transparent line, so that the first connection line 151 and the second connection line 152 have high light transmittance, which can ensure that the first display region 10 has high light transmittance.

For example, the material of the first connection line 151 and the material of the second connection line 152 may include transparent conductive material, for example, transparent metal oxides such as indium tin oxide (ITO), indium zinc oxide (IZO), etc., and the material of the metal wiring layer may include metal material such as silver (Ag), aluminum (Al), molybdenum (Mo) or titanium (Ti) or alloy materials of the metal material.

For example, each of the connection lines 15 is entirely made of transparent conductive material. For another example, in order to reduce the resistance of the connection lines 15 and increase the transmission speed of signals on the connection lines 15, each connection line may include a first part located in the first display region 10 and a second part located in the second display region 20, and the first part and the second part are electrically connected to each other. The first part includes a first light transmitting wiring layer made of transparent conductive material, and the second part includes a metal wiring layer made of metal material.

For example, as shown in FIG. 3A and FIG. 3B, the display region of the display substrate according to the embodiment further includes a third display region 30 (a conventional display region of the display substrate). For example, the third display region 30 is located below the first display region 1 and at least partially surrounds the second display region 20. The third display region 30 includes a third sub-pixel array (composed of white squares surrounding the dotted square in FIG. 3B), and the third sub-pixel array includes a plurality of second pixel units C (the white squares surrounding the dotted square). The plurality of second pixel units C are used for normal display of main portion of the display substrate. Each pixel unit C includes a fourth pixel circuit and a fourth light emitting element directly connected to each other, the fourth light emitting element and the fourth pixel circuit are located in the same pixel region, and are not separated from each other in location.

For example, as shown in FIG. 3B, a density of the array arrangement of the plurality of second pixel units C is greater than a density of the array arrangement of the plurality of first pixel units P in the second display region 20, and is also greater than a density of the array arrangement of the plurality of light emitting elements 11 in the first display region, which makes the display resolution of the third display region 30 higher than the display resolution of the second display region 20 and the display resolution of the first display region 10.

For example, as shown in FIG. 3B, the density of the array arrangement of the light emitting elements 11 in the first display region 10 is the same as the density of the array arrangement of the first pixel units P in the second display region, and the first pixel circuit array is alternately arranged in gaps of the array arrangement of the first pixel units P in the second display region 20, the first pixel circuit array is arranged to be electrically connected to the array of the light emitting elements 11 along the first direction Y1 and the second direction X1 respectively, to drive the light emitting elements 11 to emit light.

Figure 5:
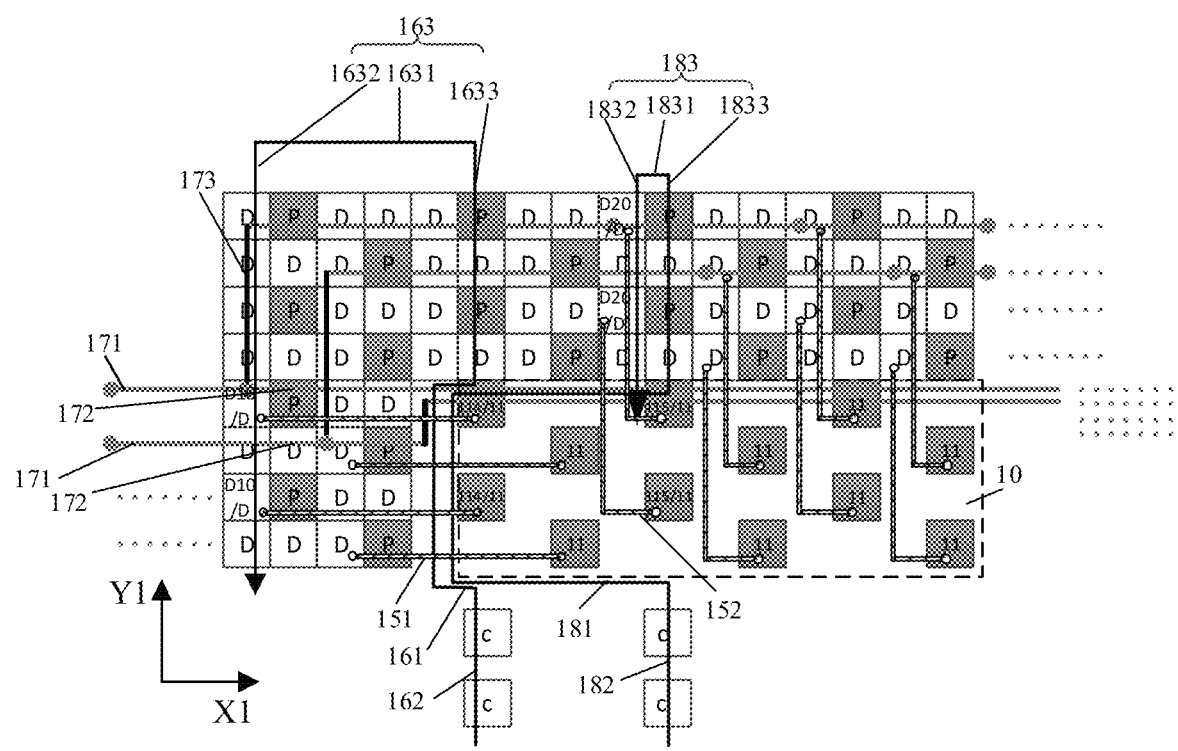
FIG. 5 is another schematic plan view of a wiring arrangement in a display region of a display substrate provided by at least one embodiment of the present disclosure.

For example, according to some embodiments of the present disclosure, as shown in FIG. 5, the display substrate further includes a first signal line 161 and a second signal line 171.

For example, as shown in FIG. 5, the first signal line 161 includes a first main portion 162 and a first winding portion 163. The first main portion 162 extends in the first direction Y1, the first main portion 162 is located below the first display region 10 and is in the third display region 30 so as to be connected to the plurality of second pixel units C and provide a first drive signal. The first winding portion 163 is routed on the edge of the first display region 10 close to the second display region 20 and is wound in the second display region 20 so as not to pass through the first display region 10. It should be noted that the arrow of the first signal line 161 in FIG. 5 is used to indicate a direction of the first driving signal provided by the first signal line 161.

For example, as shown in FIG. 5, at least part of the first winding portion 163 extends in a direction crossing the first direction Y1. In other words, the first winding portion 163 deviates from a virtual extension line of the first main portion 162 extending along the first direction Y1. The first winding portion 163 is routed on the edge of the first display region 10 close to the second display region 20 and is wound in the second display region 20, a part of the first winding portion 163 extends along the first direction Y1, and the other part of the winding portion 163 extends along the second direction X1 (intersecting the first direction Y1) to ensure the light transmittance of the first display region 10.

For example, as shown in FIG. 5, the second signal line 171 includes a second main portion 172, the second main portion 172 is located in the second display region 20 (or further located in the third display region 30) and extends in the second direction X1.

For example, as shown in FIG. 5, the first winding portion 163 of the first signal line 161 and the second main portion 172 of the second signal line 171 are electrically connected to the first pixel circuit D10 so as to respectively provide a first driving signal and a second drive signal to the first pixel circuit D10, to drive the first light emitting element 114 to emit light. An extension line of the first main portion 162 and an extension line of the second main portion 172 intersect at a position in the first display region 10 corresponding to the first light emitting element 114, thus for the sub-pixel corresponding to the first light emitting element 114 in the first display region 10, the arrangement of the corresponding (virtual) first signal line and (virtual) second signal line is the same as the arrangement of the first signal line and the second signal line corresponding to the sub-pixel in the second display region 20, and is the same as the arrangement of the first signal line and the second signal line corresponding to the sub-pixel in the third display region 30, therefore, this manner can reduce the wiring space and ensure the light transmittance of the first display region 10.

For example, according to the above embodiment, the first signal line 161 is a data line, the first driving signal is a data signal, the second signal line 171 is a gate line, and the second driving signal is a gate scan signal, so that the first pixel circuit D10 generates a light emitting driving current after receiving the data signal provided by the first signal line 161 and the gate scan signal provided by the second signal line 171, and the light emitting driving current is provided to the first light emitting element 114 through the first connection line 151 to drive the first light emitting element 114 to emit light, thus achieving display function of the sub-pixel.

For example, in some embodiments, as shown in FIG. 5, the first winding portion 163 includes a first sub-winding portion 1631, a second sub-winding portion 1632 and a third sub-winding portion 1633. The first sub-winding portion 1631 extends in the second direction X1, the second sub-winding portion 1632 extends in the first direction Y1, and the third sub-winding portion 1633 connects the first sub-winding portion 1631 and the first main portion 162. Apart of the third sub-winding portion 1633 close to the first main portion 162 is wound around edges of the first display region 10 and the second display region 20, and does not pass through the first display region 10, so that the light transmission performance of the first display region 10 will not be adversely affected. The third sub-winding portion 1633 passes through the first pixel unit P in the second display region 20, the first pixel unit P and the first light emitting element 114 are located in a same column, so that the data signal of the first light emitting element 114 in the first display region 10 and the data signal of the first pixel unit P are provided by a same data signal line (the first signal line 161). The first sub-winding portion 1631 is electrically connected to the second sub-winding portion 1632 and the third sub-winding portion 1633 by a wire jumper method, that is, the first sub-winding portion 1631 may be disposed in a different layer from other parts of the first winding portion 163. In the case that the arrangement density of the first signal lines 161 is relatively high, the design of the wire jumper can reduce the arrangement space of the first signal lines, which is more conducive to the arrangement of the wiring. The second sub-winding portion 1632 is electrically connected to the first pixel circuit D10 to provide the first driving signal (the data signal).

For example, the first sub-wiring portion 1631 may be routed on the upper edge of the second display region 20 (for example, in the peripheral region 40 outside the display region), alternatively, the first sub-wiring portion 1631 may be routed between the rows of the first pixel units P in the second display region 20 or between the rows of the first pixel circuit unit D in the second display region 20 or between the first pixel unit P and the first pixel circuit unit D, the embodiment of the present disclosure is not limited thereto.

For example, in some embodiments, as shown in FIG. 5, the third sub-winding portion 1633 surrounds the first display region 10 at the edge of the first display region 10 close to the second display region 20; for example, the third sub-winding portion 1633 is located between the first pixel units P close to the first display region 10 in the second display region 20 or between the first pixel circuit units D closer to the first display region 10; that is, the third sub-winding portion 1633 is between the first pixel unit P or the first pixel circuit unit D close to the first display region 10 in the second display region 20 and the first display region 10. In addition, the third sub-winding portion 1633 crosses the first connection line 151 between the first display region 10 and the second display region, thereby reducing the arrangement space of the first signal line, and the wiring of the third sub-winding portion 1633 avoids the first display region 10 to ensure the light transmittance of the first display region 10.

For example, the display substrate includes a base substrate, and the above-mentioned pixel circuit unit D, the light emitting element 11, the connection line 15, the first signal line 161, the second signal line 171, etc. are formed on the base substrate, for example, in the form of a laminated structure through a semiconductor manufacturing process. For example, in this laminated structure, the first main portion 162 and at least part of the first winding portion 163 are disposed in different wiring layers to increase arrangement space of the first signal line, so that the wiring can be routed in different directions.

For example, as shown in FIG. 5, the light emitting elements 114 in the first column on the left side of the first display region 10, the first pixel units P (and the first pixel circuit units D) in the second display region 20 located in the same column as the light emitting elements 114 in the first column on the left side of the first display region 10, and the first pixel circuits D10 for driving the above-mentioned first light emitting elements 114 in the first column on the left side of the second display region 20, are all connected to the first winding portion 163, so that even that the first display region 10 is provided, the light emitting elements in the same column in the entire display region can still be driven by the same first signal line 161.

For example, in some embodiments, the second signal line further includes a second winding portion, and at least part of the second winding portion extends in a direction crossing the second direction. As shown in FIG. 5, the second signal line 171 further includes a second winding portion 173, a part of the second winding portion 173 close to the second main portion 172 extends through the first pixel circuit D10 in the first direction Y1, and the second winding portion 173 extends in the second direction X1 after the second winding portion 173 is bent. For example, at least part of the second winding portion 173 extends in a direction crossing the second direction X1, in other words, the second winding portion 173 deviates from a virtual extension of the second main portion 172 extending along the second direction X1.

For example, the second winding portion 173 is electrically connected to the second main portion 172 such that the second winding portion 173 and the second main portion 172 provide a same gate scan signal.

For example, because at least part of the second winding portion 173 extends along the first direction Y1, in order to avoid short-circuiting with other second signal lines extending along the second direction X1, in the laminated structure of the base substrate, the second main portion 172 and at least part of the second winding portion 173 are disposed in different wiring layers to increase arrangement space. For example, the second main portion 172 and a part of the second winding portion 173 extending along the first direction Y1 may be disposed in different wiring layers, the routing and layer change relationship between the second winding portion 173 and the second main portion 172 will be described in detail with reference to FIG. 9.

For example, in some embodiments, as shown in FIG. 4 and FIG. 5, the display substrate further includes a third signal line 181. The third signal line 181 includes a third main portion 182 and a third winding portion 183. The third main portion 182 extends along the first direction Y1, and the third main portion 182 is located below the first display region 10 and in the third display region 30 to be connected to the plurality of second pixel units C and provide a third drive signal. For example, the third winding portion 183 is routed on the edge of the first display region 10 close to the second display region 20 and is wound in the second display region 20. It should be noted that the arrow of the third signal line 181 in FIG. 4 and FIG. 5 are used to indicate a direction of the third driving signal provided by the third signal line 181.

For example, as shown in FIG. 5, at least part of the third winding portion 183 extends in the direction crossing the first direction Y1. In other words, the third winding portion 183 deviates from a virtual extension of the third main portion 182 extending in the first direction. The third winding portion 183 is routed on the edge of the first display region 10 close to the second display region 20 and is wound in the second display region 20, a part of the third winding portion 183 extends along the first direction Y1, and the other part of the winding portion 183 extends along the second direction X1 (intersecting the first direction Y1), to ensure the light transmittance of the first display region 10.

For example, as shown in FIG. 5, the third winding portion 183 of the third signal line 181 and the second winding portion 173 of the second signal line 171 are electrically connected to the second pixel circuit D20, so as to provide the third driving signal and the second driving signal for the second pixel circuit D20, thereby the second pixel circuit D20 generates a driving current according to the third driving signal and the second driving signal, to drive the second light emitting element 115 in the first display region 10 to emit light.

For example, in the first display region 10, the first pixel circuit D10 corresponding to the first light emitting element 114 is electrically connected to the second main portion 172 of the second signal line 171, and the second pixel circuit D20 corresponding to the second light emitting element 115 is electrically connected to the second winding portion 173 of the second signal line 171, so that both the first light emitting element 114 and the second light emitting element 115 are provided with the second driving signal by the second signal line 171. For example, although the first pixel circuit D10 and the second pixel circuit D20 in the second display region 20 respectively corresponding to the first light emitting element 114 and the second light emitting element 115 located in a same row in the first display region 10 are respectively located on the left side of the first display region 10 and the upper side of the first display region 10, the first pixel circuit D10 and the second pixel circuit D20 are still driven by the same second signal line 171, so there is no need to modify the design of the gate driving circuit and the like.

For example, the first signal line 161 and the third signal line 181 are both data lines, and the first driving signal and the third driving signal are both data signals.

For example, as shown in FIG. 5, the third winding portion 183 includes a fourth sub-winding portion 1831, a fifth sub-winding portion 1832, and a sixth sub-winding portion 1833. The fourth sub-winding portion 1831 extends in the second direction X1, the fifth sub-winding portion 1832 extends in the first direction Y1, and the sixth sub-winding 1833 connects the fourth sub-winding portion 1831 and the third main portion 182. A part of the sixth sub-winding portion 1833 close to the third main portion 182 is wound around the edges of the first display region 10 and the second display region 20, and does not pass through the first display region 10, so that the light transmission performance of the first display region 10 will not be adversely affected. The sixth sub-winding portion 1833 passes through the first pixel unit P in the second display region 20, and the first pixel unit P and the second light emitting element 115 are located in a same column, so that the data signal of the second light emitting element 115 in the first display region 10 and the data signal of the first pixel unit P are provided by a same data signal line (the first signal line 181).

For example, the fourth sub-winding portion 1831 is electrically connected to the fifth sub-winding portion 1832 and the sixth sub-winding portion 1833 by a wire jumper method, that is, the fourth sub-winding portion 1831 may be disposed in a different layer from other parts of the third winding portion 183. In the case that the arrangement density of the third winding portion 183 is relatively high, the design of the wire jumper can reduce the arrangement space of the first signal lines, which is more conducive to the arrangement of the wiring. The fifth sub-winding portion 1832 is electrically connected to the second pixel circuit D20 to provide the third driving signal (the data signal).

For example, the fourth sub-winding portion 1831 may be routed on the upper edge of the second display region 20 (for example, in the peripheral region 40 outside the display region), alternatively, the fourth sub-winding portion 1831 may be routed between the rows of the first pixel units P in the second display region 20 or between the rows of the first pixel circuit unit D in the second display region 20 or between the first pixel unit P and the first pixel circuit unit D, the embodiment of the present disclosure is not limited thereto.

For example, the routing manner of the third signal line 181 and its relationship with other layers may be the same as the first signal line 161.

Although in the example shown in FIG. 3A, the first display region 10 is circular, the embodiment of the present disclosure does not limit the shape of the first display region 10. For example, the first display region 10 may also be rectangular, oval, rounded rectangle (racetrack-shaped), etc. In addition, the embodiment of the present disclosure does not limit the number of the first display region 10, for example, the display substrate may include two first display regions 10 at least partially surrounded by the second display region 20.

Figure 6A:
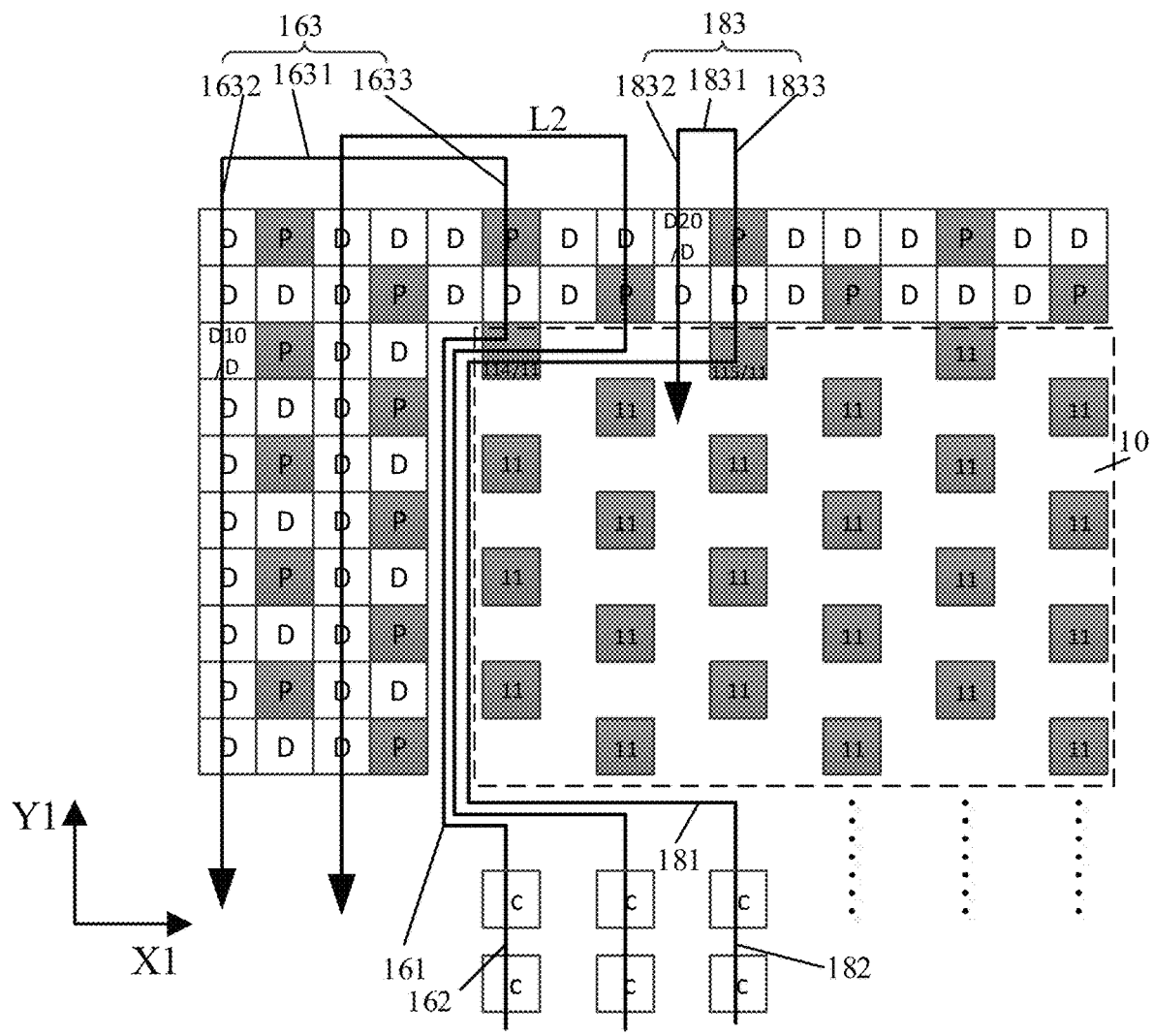
FIG. 6A is a schematic plan view of a wiring arrangement of a first signal line and a second signal line in a display region of a display substrate provided by at least one embodiment of the present disclosure.

For example, in some embodiments, as shown in FIG. 6A, in the case that the first display region 10 is rectangular, the first winding portion 163 of the first signal line 161 and the third winding portion 183 of the third signal line 181 are routed around an edge of the first display region 10 at a boundary between the first pixel circuit array of the second display region 20 and the first sub-pixel array of the first display region 10, to improve the light transmission of the first display region and increase wiring space. It should be noted that the arrows in FIG. 6A are used to indicate the direction of the data signals provided by the data lines (for example, the first signal line 161 and the third signal line 181).

Figure 6B:
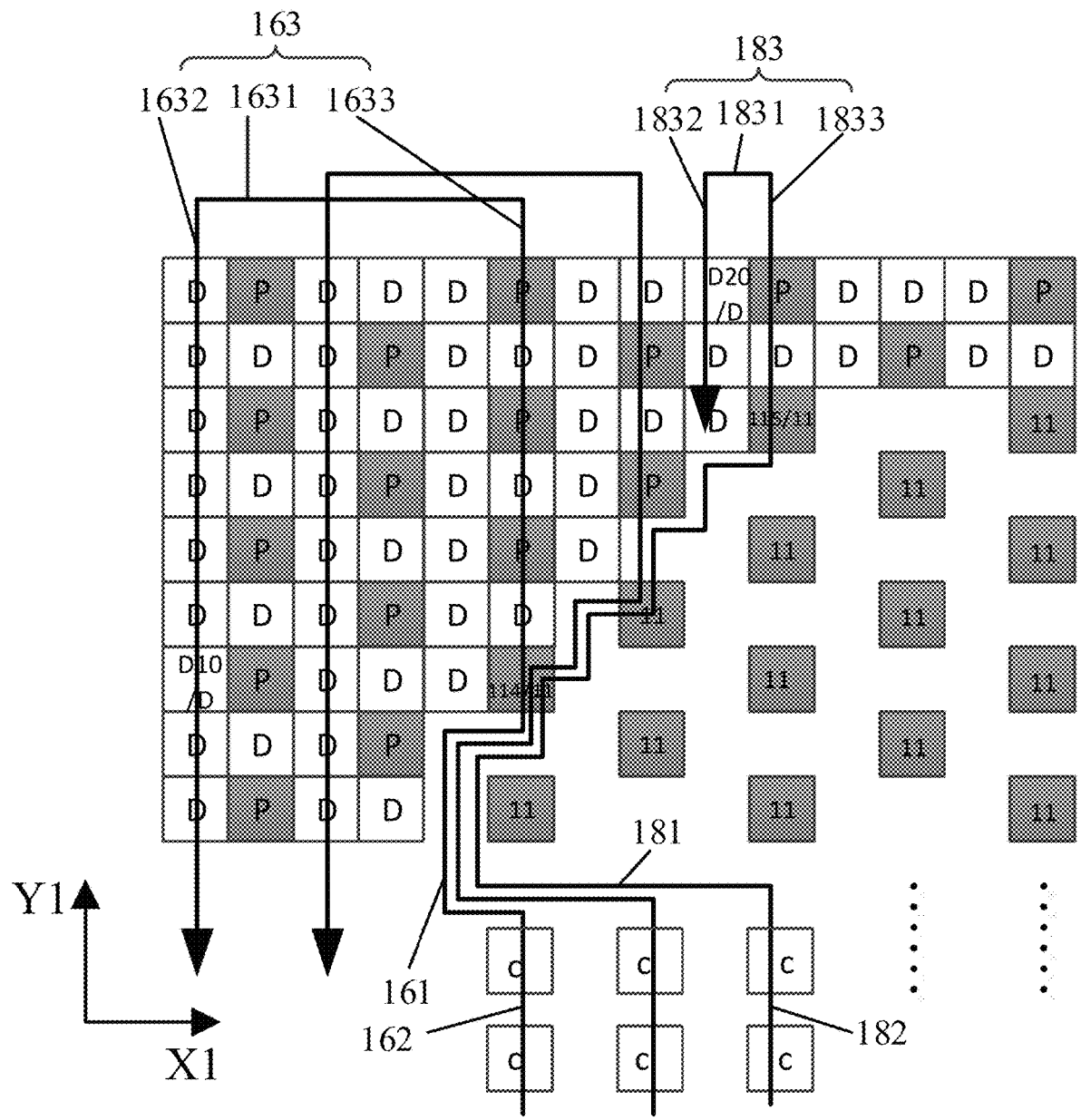
FIG. 6B is another schematic plan view of a wiring arrangement of a first signal line and a second signal line in a display region of a display substrate provided by at least one embodiment of the present disclosure.

For example, in another embodiment, as shown in FIG. 6B, in the case that the first display region 10 is oval or circular, the first winding portion 163 of the first signal line 161 and the third winding portion 183 of the third signal line 181 are routed around the edge of the first display region 10 at a boundary between the first pixel circuit array of the second display region 20 and the first sub-pixel array of the first display region 10 in a circular winding manner. That is, the first winding portion 163 and the third winding portion 183 are stepped at the boundary between the second display region 20 and the first display region 10, to increase the light transmittance of the first display region 10 and increase the wiring space. It should be noted that the arrows in FIG. 6B is used to indicate the direction of the data signals provided by the data lines (for example, the first signal line 161 and the third signal line 181).

For example, in some embodiments, as shown in FIG. 5, FIG. 6A, and FIG. 6B, the first main portion 162 of the first signal line 161 extends in the third display region 30 to be electrically connected to the second pixel circuit C located in the first direction Y1 with respect to the first light emitting element 114 (in the same column) to provide the first drive signal, and the third main portion 182 of the third signal line 181 extends in the third display region 30 to be electrically connected to the second pixel circuit C located in the first direction Y1 with respect to the second light emitting element 115 (in the same column) to provide the third drive signal. Therefore, the second pixel units C located in the same column as the first light emitting element 114 are provided with the data signal by the same first signal line, the second pixel units C located in the same column as the second light emitting element 115 are provided with the data signal by the same third signal line, and the first light emitting element 114 and the second light emitting element 115 may be further located in a same row.

It should be noted that the data line that provides data signals to the first pixel circuit D10 electrically connected to the first light emitting element 114 is the first signal line 161 in the above-mentioned embodiment, and the data line that provides data signals to the second pixel circuit D20 electrically connected to the second light emitting element 115 is the third signal line 181 in the above-mentioned embodiment. There may be a plurality of first signal lines 161 and a plurality of third signal lines 181, and FIG. 5, FIG. 6A, and FIG. 6B only exemplarily show a part of the plurality of first signal lines 161 and the plurality of third signal lines 181.

For example, as shown in FIG. 4, FIG. 5, FIG. 6A, and FIG. 6B, the area occupied by a gray square (the light emitting element 11 and the first pixel unit P) corresponds to a pixel in the display region, which emits light based on the driving signal during display. On the other hand, the white squares (the first pixel circuit units D) drive a plurality of light emitting elements 11 in the first display region 10 respectively, thereby providing a plurality of functional sub-pixels.

Figure 7:
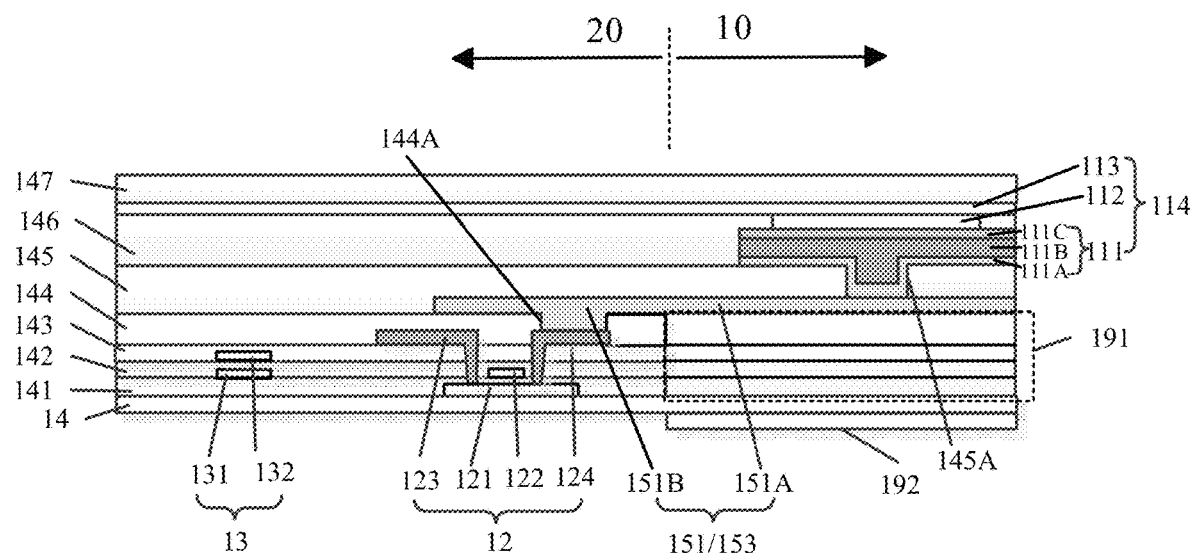
FIG. 7 is a schematic cross-sectional view of the display substrate in FIG. 3A along line A-A.

For example, FIG. 7 is a schematic cross-sectional view of the display substrate in FIG. 3A along the line A-A to schematically show the structure and connection relationship of the first pixel circuit D10, the first connection line 151 and the first light emitting element 114. The structure and connection relationship of the second pixel circuit D20, the second connection line 152 and the second light emitting element 115 are similar, which will not be repeated.

As shown in FIG. 7, the first pixel circuit D10 includes a thin film transistor 12 and a storage capacitance 13. The thin film transistor 12 includes an active layer 121, a gate electrode 122, a first gate insulating layer 141, a second gate insulating layer 142, an interlayer insulating layer 143, and source and drain electrodes (a source electrode 123 and a drain electrode 124). The storage capacitance 13 includes a first capacitance plate 131 and a second capacitance plate 132. The active layer 121 is disposed on the base substrate 14, the first gate insulating layer 141 is disposed on a side of the active layer 121 away from the base substrate 100, and the gate electrode 122 and the first capacitance plate 131 are disposed in a same layer on a side of the first gate insulating layer 141 away from the base substrate 14, the second gate insulating layer 142 is disposed on a side of the gate electrode 122 away from the base substrate 14 and a side of the first capacitance plate away from the base substrate 14. The second capacitance plate 132 is disposed on a side of the second gate insulating layer 142 away from the base substrate 14, and the interlayer insulating layer 143 is disposed on a side of the second capacitance plate 132 away from the base substrate 14. The source electrode 123 and the drain electrode 124 are disposed on a side of the interlayer insulating layer 143 away from the base substrate 14 and are electrically connected to the active layer 121 through via holes in the first gate insulating layer 141, the second gate insulating layer 142, and the interlayer insulating layer 143.

For example, as shown in FIG. 7, the display substrate further includes a first planarization layer 144, and the first planarization layer 144 is disposed on a side of the source and drain electrodes (the source electrode 123 and the drain electrode 124) away from the base substrate 14 to provide a first planarization surface, and the first planarization layer comprises first via holes 144A. The second signal line 171 is disposed in a same layer as the gate electrode 122 and the first capacitance plate 131. That is, the second signal line 171, the gate electrode 122 and the first capacitor plate 131 can be made of a same material and formed in a same patterning process. The first signal line 161 and the third signal line 181 are disposed in a same layer as the source and drain electrodes (the source electrode 123 and the drain electrode 124). That is, the first signal line 161, the third signal line 181 and the source and drain electrodes can be made of a same material and formed in a same patterning process.

It should be noted that, in the embodiments of the present disclosure, "disposed in a same layer" includes that two functional layers or structural layers are formed in a same layer and with the same material in the hierarchical structure of the display substrate, that is, in the preparation process, the two functional layers or structural layers may be formed from a same material layer, and required pattern and structure of the two functional layers or structural layers may be formed through a same patterning process. A patterning process includes, for example, photoresist formation, exposure, development, etching, etc.

For example, as shown in FIG. 7, the first connection line 151 (or the second connection line 152) is located in a light transmitting wiring layer 153, and the first connection line 151 is on the first planarization surface and located in the first display region 10 and the second display region 20. The first connection line 151 includes a first part 151A located in the first display region 10 and a second part 151B located in the second display region 20. The second part 151B of the first connection line 151 is electrically connected to the drain electrode 124 (or the source electrode 123) of the thin film transistor 12 through the first via holes 144A of the first planarization layer 144 in the second display region 20.

For example, the display substrate further includes a second planarization layer 145 disposed on a side of the first connection line 151 away from the base substrate 14 to provide a second planarization surface, and the second planarization layer includes second via holes 145A located in the first display region 10. The first light emitting element 114 (or the second light emitting element 115) in the first display region 10 is on the second planarization surface and is electrically connected to the first part 151A of the first connection line 151 in the first display region 10 through the second via hole 145A.

For example, as shown in FIG. 7, the first light emitting element 114 (or the second light emitting element 115) includes a first electrode structure 111, a second electrode structure 113, and a first light emitting layer 112 between the first electrode structure 111 and the second electrode structure 113. The first electrode structure 111 is a first anode structure of the first light emitting element 114, and the second electrode structure 113 is a first cathode structure of the first light emitting element 114. When there is a voltage difference between the first anode structure and the first cathode structure, the first light emitting layer 112 between the first anode structure and the first cathode structure can emit light. For example, an orthographic projection of the first light emitting layer 112 on the first anode structure is located inside the first anode structure, and an orthographic projection of the first light emitting layer 112 on the first cathode structure is located inside the first cathode structure, so that the first anode structure and the first cathode structure can sufficiently drive the first light emitting layer 112 to emit light.

For example, in some embodiments, the first cathode structure may be a structure formed on the entire surface of the display substrate, and the first cathode structure may be formed by metal material, such lithium (Li), aluminum (Al), magnesium (Mg), silver (Ag), etc. or any of their alloys. Because the first cathode structure can be formed as a very thin layer, the second electrode structure 113 has good light transmittance.

For example, as shown in FIG. 7, the first electrode structure 111 is electrically connected to the first part 151A of the first connection line 151 in the first display region 10 through the second via holes 145A of the second planarization layer 145. The first anode structure may include a multi-layer laminated structure. For example, the first electrode structure 111 includes a first electrode sublayer 111A, a second electrode sublayer 111B laminated with the first electrode sublayer 111A and a third electrode sublayer 111C laminated with the first electrode sublayer 111A, whereby the first anode structure has a three-layer laminated structure. Of course, in other embodiments of the present disclosure, the first anode structure may also be a single-layer structure, a double-layer structure, etc. The embodiments of the present disclosure do not limit the specific form of the first anode structure.

For example, the first electrode sublayer 111A, the second electrode sublayer 111B and the third electrode sublayer 111C are all surface electrodes, planar shapes and sizes of the first electrode sublayer 111A, the second electrode sublayer 111B and the third electrode sublayer 111C are basically the same (that is, the shapes and sizes of the orthographic projections of the first electrode sublayer 111A, the second electrode sublayer 111B and the third electrode sublayer 111C on the base substrate 14 are basically the same), and any two adjacent electrode sublayers are in direct and complete contact. In this case, the orthographic projection of the first light emitting layer 112 on any one of the electrode sublayers in the first anode structure is located inside the electrode sublayer.

For example, according to some embodiments, the material of the first electrode sublayer 111A may include indium tin oxide (ITO), the material of the second electrode sublayer 111B may include silver (Ag) or silver alloy, and the material of the third electrode sublayer 111C may include indium tin oxide (ITO). Thus, the first anode structure has an ITO/Ag/ITO three-layer laminated structure.

For example, in other embodiments, the first electrode sublayer 111A and the first part 151A of the first connection line 151 may be disposed in a same layer and electrically connected to each other, for example, integrally connected. That is, the first electrode sublayer 111A and the first part 151A of the first connection line 151 are disposed in the same layer and are in direct contact, thereby forming an integral structure.

Figure 8A:
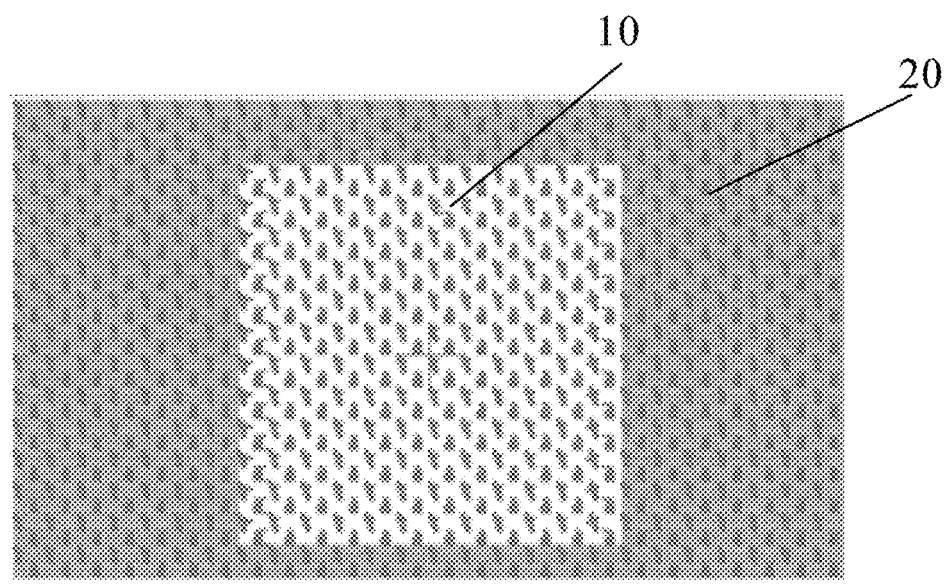
FIG. 8A is a schematic plan view of a first display region and a second display region of a display substrate provided by at least one embodiment of the present disclosure.
Figure 8B:
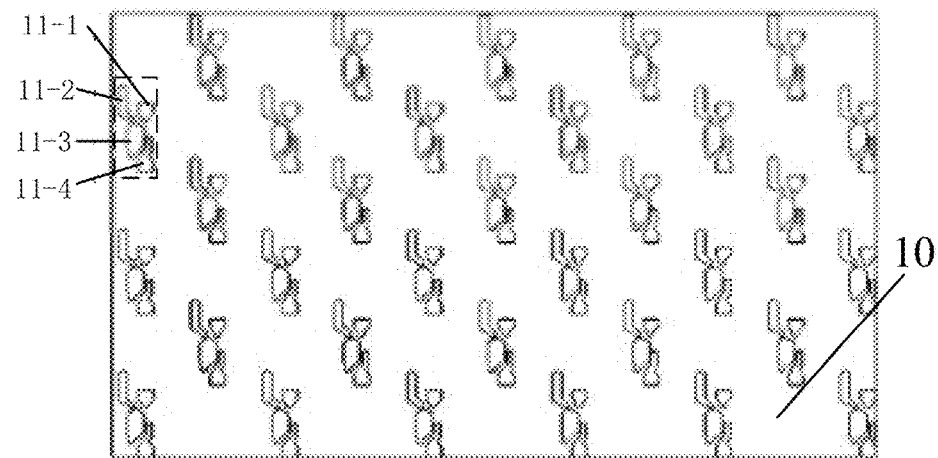
FIG. 8B is a schematic plan view of a first sub-pixel array in a first display region of a display substrate provided by at least one embodiment of the present disclosure.

For example, in some embodiments, FIG. 8A is a schematic plan view of a first display region and a second display region of the display substrate provided by at least one embodiment of the present disclosure; FIG. 8B is a schematic plan view of a first sub-pixel array in the first display region of the display substrate provided by at least one embodiment of the present disclosure.

FIG. 8A and FIG. 8B show the arrangement pattern of the first sub-pixel array in the first display region 10 and the arrangement pattern of the second sub-pixel array in the second display region 20. Every four sub-pixels constitute a repeating unit, that is, constitute a pixel. Each sub-pixel includes a corresponding pixel circuit and a corresponding light emitting element, and each sub-pixel has a different planar shape. Correspondingly, the anode structure of the light emitting element of each sub-pixel also has a different planar shape, and is corresponding to light emitting element of the same or different color, for example, a repeating unit may include four sub-pixels of GGRB. The layout shown in FIG. 8A and FIG. 8B is different from the layout shown in FIG. 4, etc., in that the layout shown in FIG. 8A and FIG. 8B is repeated in units of pixels to obtain an array.

The embodiment of the present disclosure does not limit the array form in the display region. For example, as shown in FIG. 8B, a pixel unit in the first display region 10 includes four light emitting elements 11, and the four light emitting elements 11 constitute a repeating unit, and the four light emitting elements 11 include a light emitting element 11-1, a light emitting element 11-2, a light emitting element 11-3 and a light emitting element 11-4. The light emitting element 11-1, the light emitting element 11-2, the light emitting element 11-3 and the light emitting element 11-4 may respectively have different or the same planar shapes, and may respectively emit light of different or the same color, to form a repeating unit including four sub-units. Therefore, the first anode structures of the four light emitting elements of each first sub-pixel have different planar shapes, and are arranged according to the arrangement shown in FIG. 8B to correspondingly emit light of the same or different colors, for example, the four light emitting elements may respectively emit light of different colors such as green, green, red, and blue.

According to a specific embodiment, the above repeating unit may not be limited to include four sub-pixels, for example, the repeating unit may include three sub-pixels, including R, G, and B, or the repeating unit may be arranged in other manners, such as RGBG.

For example, the four light emitting elements 11 (the first light emitting element 114 and/or the second light emitting element 115) included in a same pixel unit of the first display region 10 are respectively driven by four different pixel circuits (the first pixel circuit D10 and/or the second pixel circuit D20), so the four light emitting elements 11 are connected to the four pixel circuits through four different connection lines 15 (the first connection line 151 and/or the second connection line 152). The four pixel circuits may be arranged in different locations in the second display region 20, for example, in a same row or in different rows, in a same column or in different columns.

Figure 8C:
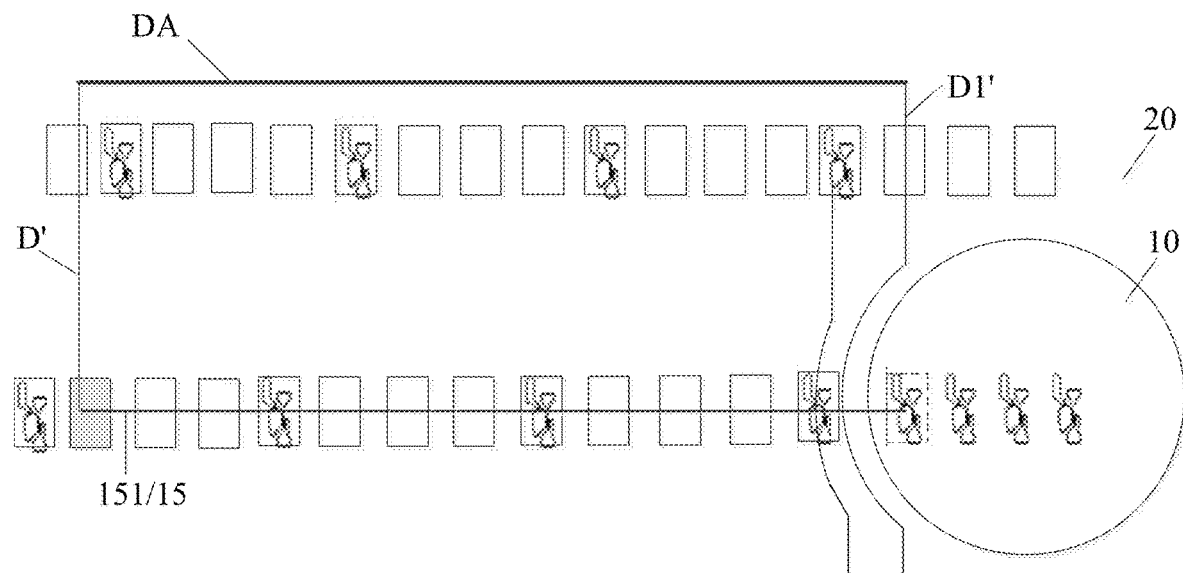
FIG. 8C is a schematic plan view of a wiring arrangement in a display region of the display substrate provided by the embodiment shown in FIG. 8A.
Figure 8D:
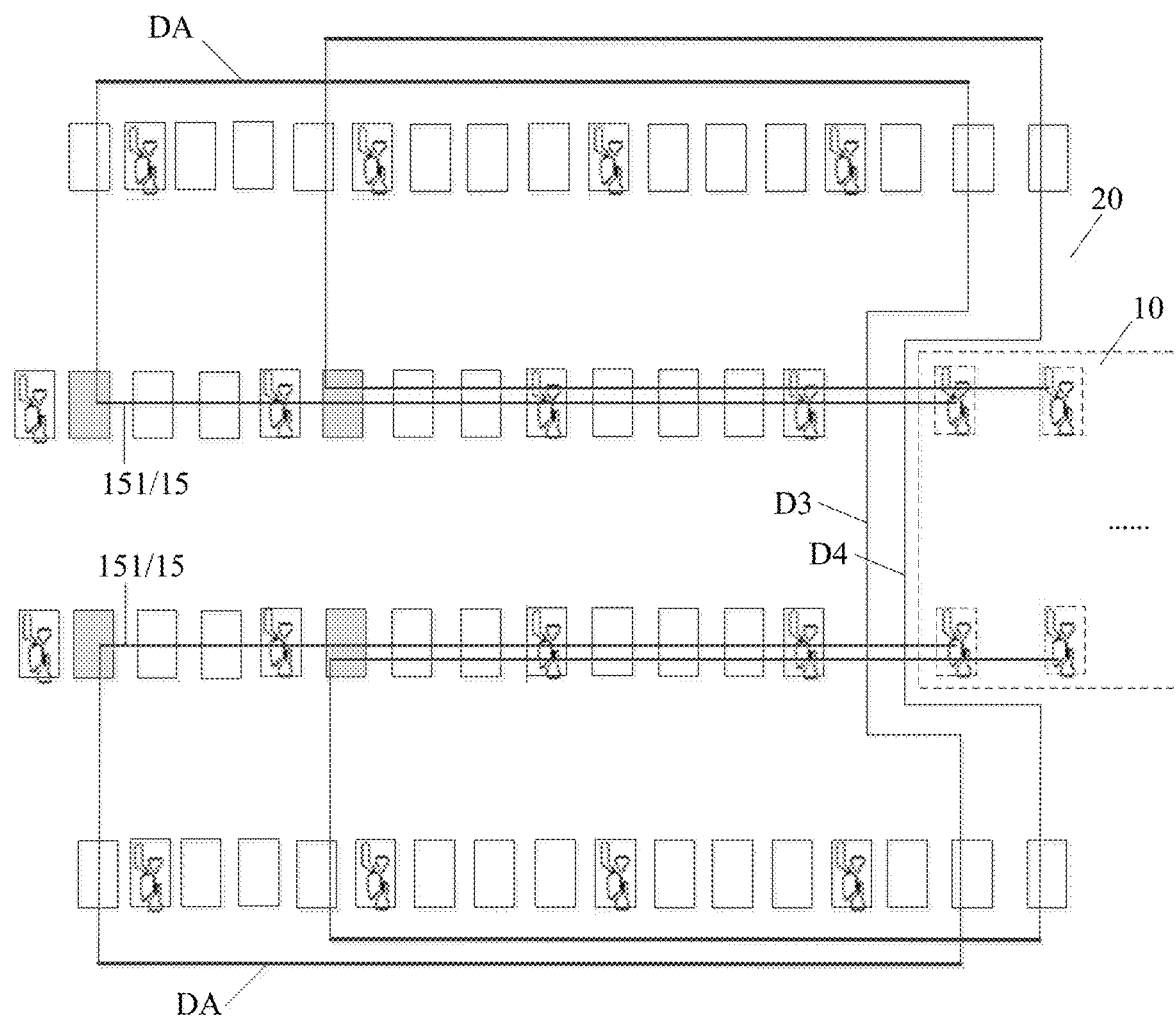
FIG. 8D is another schematic plan view of a wiring arrangement in a display region of the display substrate provided by the embodiment shown in FIG. 8A.

FIG. 8C and FIG. 8D are schematic plan views of a wiring arrangement in the display region of the display substrate provided by the embodiment shown in FIG. 8A, respectively.

For example, FIG. 8C shows the connection manner of a data line D1' (the first signal line 161) in the case that the plurality of the light emitting elements of the first sub-pixel array in the first display region 10 and the plurality of the first pixel units of the second sub-pixel array in the second display region 20 are arranged according to the above-mentioned sub-pixel arrangement. As shown in FIG. 8C, the data line D1' is arranged around the boundary of the second display region 20 close to the first display region 10, and in the first display region 10 and the second display region 20, the pixel circuits of the sub-pixels located in a same column are electrically connected to a same data line D1'.

For example, in the embodiment shown in FIG. 8C, a first pixel circuit located in the second display region 20 shown by a gray square is electrically connected to a first light emitting element (ie, the first light emitting element on the left) on the left side of the first display region 10 through a first connection line 151. The pixel circuits of the sub-pixels in a same column as the first light emitting element (no matter the plurality of the light emitting elements of the first sub-pixel array in the first display region 10 or the plurality of the first pixel units of the second sub-pixel array in the second display region 20) may be electrically connected to the data line D1' through the winding of the data line D1', thereby the pixel circuits of the sub-pixels in the same column may be electrically connected to the same data line. For example, a part DA of the data line D1' (shown as a thick line extending horizontally on the upper side of the data line D1') may be set in the manner of wire jumper, that is, the part DA of the data line D1' may be arranged in a different layer from the other part of the data line D'. For example, in the case that the arrangement density of the data line D1' is relatively high, the design of the wire jumper can be more conducive to the wiring setting.

For example, FIG. 8C only shows the connection lines and data lines, etc. of one first sub-pixel in the first display region 10, other first sub-pixels in the first display region 10 also have the similar connection relationship, which is not shown in FIG. 8C. For example, the area occupied by the gray square may have the pixel circuit of one or more sub-pixel pixel circuits in a pixel circuit repeating unit. In this case, the one or more first pixel circuits may be electrically connected to one or more light emitting elements of one pixel repeating unit in the first display region 10 respectively through one or more connection lines 15 (or first connection lines 151).

For example, the area occupied by the gray square may have four first pixel circuits corresponding to four light emitting elements of one pixel unit. In this case, the four first pixel circuits may be connected to the four light emitting elements of one pixel unit in the first display region 10 respectively through four connection lines 15 (or first connection lines 151).

For example, in some embodiments, the data line D' may be wound on one side of the second display region 20. For example, FIG. 8C shows a situation where the data line D' is wound on the upper side of the second display region 20.

In other embodiments, as shown in FIG. 8D, the data line D' may also be wound on the upper and lower sides of the second display region 20.

For example, in some embodiments, the data line D' may be routed between the pixel rows of the second display region 20, the embodiment of the present disclosure is not limited thereto.

For example, as shown in FIG. 8D, in this embodiment, the pixel circuits of the first column of sub-pixels on the left in the first display region 10 and the second display region 20 are connected by a same data line D3 (the data line on the left in the figure), the pixel circuits of the second column of sub-pixels on the left are connected by a same data line D4 (the data line on the right in the figure), and the data lines are simultaneously wound on the upper and lower sides of the second display region 20 so as to be electrically connected to the pixel circuits of the sub-pixels in the same column, so that the light emitting elements of the sub-pixels located in the same column can be driven by the same data line. Similarly, a part DA of the data line D3 and a part DA of the data line D4 can also adopt a wire jumper design. For example, the data lines are arranged densely at the edge of the second display region 20, so part of the data lines wound around the edge can be designed with wire jumpers to save space and simplify the circuit arrangement.

Similarly, FIG. 8D only shows the connection lines and data lines, etc. of the light emitting elements of four sub-pixels in the first display region 10, light emitting elements of other first sub-pixels in the first display region 10 also have a similar connection relationship, which is not shown in FIG. 8D. For example, the area occupied by the gray square may have four first pixel circuits corresponding to light emitting elements of four sub-pixels of one pixel repeating unit, in this case, the four first pixel circuits may be electrically connected to the light emitting elements of four sub-pixels of one pixel repeating unit in the first display region 10 respectively through four first connection lines 151.

Figure 9:
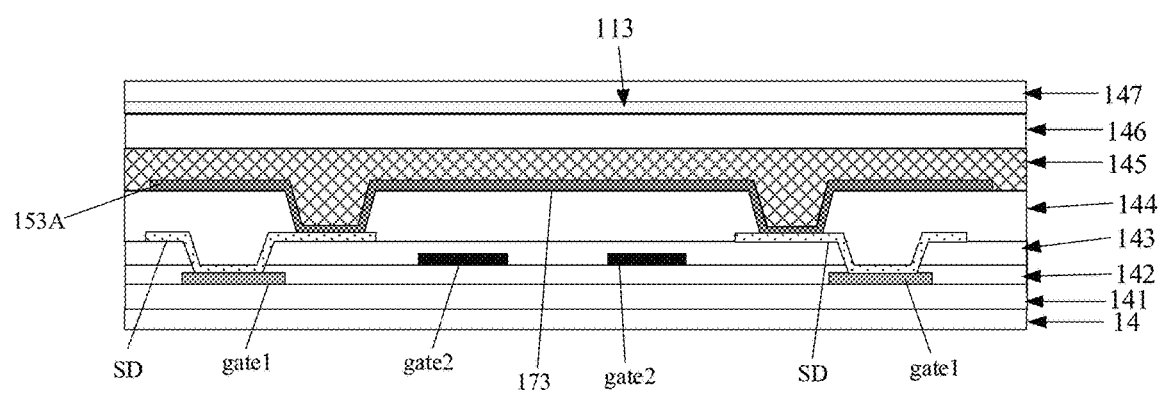
FIG. 9 is a schematic cross-sectional view of the display substrate in FIG. 4 along the line L1-L1.

FIG. 9 is a schematic cross-sectional view of the display substrate in FIG. 4 along the line L1-L1, the section line L1-L1 in FIG. 4 passes through the second winding portion 173 of the second signal line 171.

As shown in FIG. 9, the display substrate includes a first wire-connection layer gate1, a second wire-connection layer gate2, a source-drain wire-connection layer SD, and a wiring layer 153A. The first wire-connection layer gate1 is disposed on a side of the first gate insulating layer 141 away from the base substrate 14 and disposed in a same layer as the gate electrode 122 and the first capacitance plate 131, for example, the first wire-connection layer gate1 includes a second main portion 172 of a second signal line 171. The second wire-connection layer gate2 is disposed on a side of the second gate insulating layer 142 away from the base substrate 14 and disposed in the same layer as the second capacitance plate 132, for example, the second wire-connection layer gate2 includes a second main portion 172 of another second signal line 171. The source-drain wire-connection layer SD is disposed on a side of the interlayer insulating layer 143 away from the base substrate 14 and includes a plurality of transfer electrodes that are independent of each other, and these transfer electrodes are respectively electrically connected to the second main portion 172 of the second signal line 171 arranged in the first wire-connection layer gate1 through a plurality of via holes in the second gate insulating layer 142 and the interlayer insulating layer 143. The source-drain wire-connection layer SD is disposed in the same layer as the source and drain electrodes of the pixel circuit. The first planarization layer 145 is disposed on a side of the source-drain wire-connection layer SD away from the base substrate 14 to provide a planarization surface, the first planarization layer 145 includes a plurality of via holes. The wiring layer 153A is disposed on a side of the first planarization layer 145 away from the base substrate 14. For example, the wiring layer 153A is disposed in the same layer as the light transmitting wiring layer 153. The wiring layer 153A is patterned to achieve the second winding portion 173 of the second signal line 171, and is electrically connected to the transfer electrodes in the source-drain wire-connection layer SD through the via holes of the first planarization layer 145, and then the wiring layer 153A is further electrically connected to the second main portion 172 of the second signal line 171, so as to implement a wire jumper structure, thus the second driving signal can be provided to the first pixel circuit D10 and the second pixel circuit D20.

It should be noted that, as shown in FIG. 9, the second wire-connection layer gate2 exemplarily represents a metal signal line, other film layers or signal lines, etc. may be provided in the area where the second wire-connection layer gate2 is located. The structure shown in FIG. 9 does not represent the structure of the actual driving circuit, that is, FIG. 9 exemplarily shows a wire jumper structure of the second winding portion 173 of the second signal line 171.

For example, in other embodiments, the second winding portion 173 of the second signal line 171 may also implement a wire jumper structure through a connection line (for example, extending along the first direction Y1) at a same layer as the data line (for example, the first signal line 161 and the third signal line 181), and the embodiment of the present disclosure is not limited thereto.

Figure 10A:
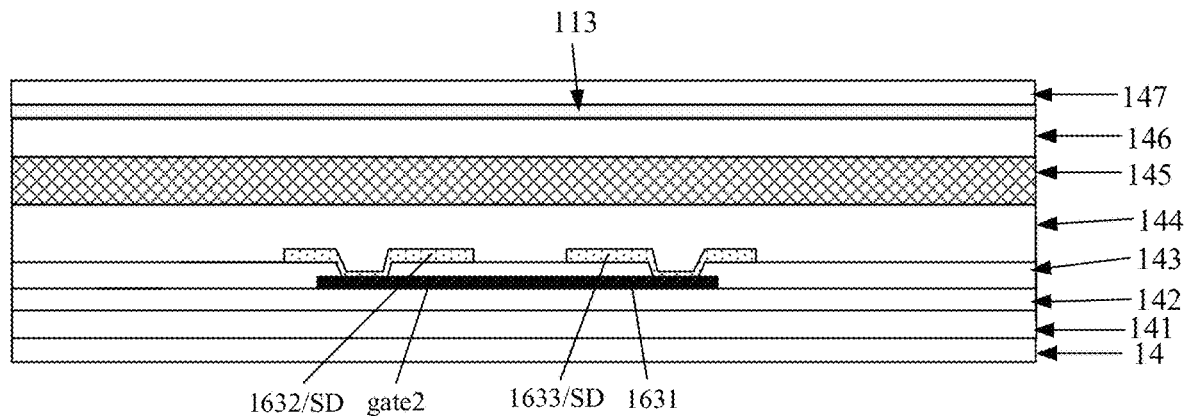
FIG. 10A is a schematic cross-sectional view of the display substrate in FIG. 6A along the line L2-L2.

For example, in some embodiments, FIG. 10A is a schematic cross-sectional view of the display substrate in FIG. 6A along the line L2-L2, and the section line L2-L2 in FIG. 10A passes through the first winding portion 163 of the first signal line 161. The source-drain wire-connection layer SD is electrically connected to the second wire-connection layer gate2 through the via holes in the interlayer insulating layer 143. At this position, the second wire-connection layer gate2 is disposed in a same layer as gate lines in other positions (for example, gate lines in the same layer as the second capacitance plate 132) of the display substrate and is disconnected, and the second wire-connection layer gate2 includes the first sub-winding portion 1631 of the first winding portion. The two source-drain wire-connection layers SD respectively include a second sub-winding portion 1632 and a third sub-winding portion 1633. For example, the second sub-winding portion 1632 and the third sub-winding portion 1633 disposed in the source-drain wire-connection layer SD are respectively electrically connected to two ends of the first sub-winding portion 1631 disposed in the second wire-connection layer gate2, to achieve the electrical connection of the first sub-winding portion 1631 of the first winding portion 163 with the second sub-winding portion 1632 and the third sub-winding portion 1633 of the first winding portion 163, thereby achieving a wire jumper structure. The first winding portion 163 of the first signal line 161 achieves the transferring of the first driving signal through the second wire-connection layer gate2 and provides the first driving signal to the first pixel circuit D10.

Figure 10B:
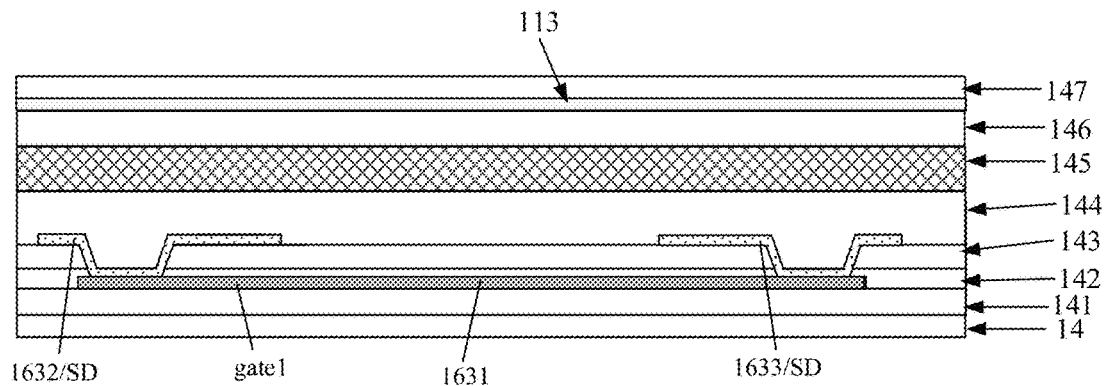
FIG. 10B is another schematic cross-sectional view of the display substrate in FIG. 6A along the line L2-L2.

For example, in other embodiments, FIG. 10B is another schematic cross-sectional view of the display substrate in FIG. 6A along the line L2-L2, and the section line L2-L2 in FIG. 6A passes through the first winding portion 163 of the first signal line 161. The source-drain wire-connection layer SD is electrically connected to the first wire-connection layer gate1 through the via holes in the second gate insulating layer 142 and the interlayer insulating layer 143. At this position, the first wire-connection layer gate1 is disposed in the same layer as gate lines in other positions (for example, gate lines in the same layer as the first capacitance plate 131) of the display substrate and is disconnected, and the first wire-connection layer gate1 includes the first sub-winding portion 1631 of the first winding portion 163. The two source-drain wire-connection layers SD respectively include a second sub-winding portion 1632 and a third sub-winding portion 1633. For example, the second sub-winding portion 1632 and the third sub-winding portion 1633 disposed in the source-drain wire-connection layer SD are respectively electrically connected to two ends of the first sub-winding portion 1631 disposed in the second wire-connection layer gate2, to achieve the electrical connection of the first sub-winding portion 1631 of the first winding portion 163 with the second sub-winding portion 1632 and the third sub-winding portion 1633 of the first winding portion 163, thereby achieving a wire jumper structure. The first winding portion 163 of the first signal line 161 achieves the transferring of the first driving signal through the second wire-connection layer gate2 and provides the first driving signal to the first pixel circuit D10.

For example, as shown in FIGS. 4, 5, 6A and 6B, FIG. 8C and FIG. 8D, and FIG. 11, each of the plurality of first pixel units P in the second display region 20 of the display substrate includes a third light emitting element 21 and a third pixel circuit, the third pixel circuit is electrically connected to the third light emitting element 21 to drive the third light emitting element 21. For example, the second pixel circuit includes structures such as a thin film transistor 22 and a storage capacitance 23. The third light emitting element 21 includes a third electrode structure 211, a fourth electrode structure 213, and a second light emitting layer 212 between the third electrode structure 211 and the fourth electrode structure 213. the third electrode structure 211 is electrically connected to the second pixel circuit through a via hole. For example, the third electrode structure 211 is the anode structure of the third light emitting element 21, and the fourth electrode structure 213 is the cathode structure of the third light emitting element 21. For example, the third electrode structure 211 may include a plurality of electrode sub-layers, for example, a three-layer structure of ITO/Ag/ITO (not shown in the figure), etc. The specific form of the third electrode structure 211 is not limited in the embodiment of the present disclosure.

For example, the thin film transistor 22 includes an active layer 221, a gate electrode 222, a first gate insulating layer 141, a second gate insulating layer 142, an interlayer insulating layer 143, source and drain electrodes (ie, source electrode 223 and drain electrode 224), and a transfer electrode 215, a light emitting element 31, and a pixel defining layer 146 and other structures, and the storage capacitance 23 includes a first capacitance plate 231 and a second capacitance plate 232.

For example, the active layer 221 is disposed on the base substrate 14, the first gate insulating layer 141 is disposed on a side of the active layer 221 away from the base substrate 14, and the gate electrode 222 and the first capacitance plate 231 are disposed in a same layer on a side of the first gate insulating layer 141 away from the base substrate 14, the second gate insulating layer 142 is disposed on a side of the gate electrode 222 away from the base substrate 14 and a side of the first capacitance plate 231 away from the base substrate 14, and the second capacitance plate 232 is disposed on a side of the second gate insulating layer 142 away from the base substrate 14, the interlayer insulating layer 143 is disposed on a side of the second capacitance plate 232 away from the base substrate 14, and the source and drain electrodes are disposed on a side of the interlayer insulating layer 143 away from the base substrate 14 and are electrically connected to the active layer 221 through the via holes in the first gate insulating layer 141, the second gate insulating layer 142, and the interlayer insulating layer 143. A first planarization layer 144 is disposed on the side of the source and drain electrodes away from the base substrate 14, and the first planarization layer 144 provides a first planarization surface to planarize the third pixel circuit.

For example, first via holes 144A are provided in the first planarization layer 144, and the first transfer electrode 215 is disposed on a side of the first planarization layer away from the base substrate 14 and is electrically connected to the source electrode 223 of the source and drain electrodes through the first via hole 144A. The second planarization layer 145 is disposed on a side of the first transfer electrode 215 away from the base substrate 14 and provides a second planarization surface, second via holes 145A are provided in the second planarization layer 145.

For example, the third electrode structure 211 is electrically connected to the first transfer electrode 215 through the second via hole 145A in the second planarization layer 145. The pixel defining layer 146 is disposed on a side of the third electrode structure 211 away from the base substrate 14 and includes a plurality of openings. The second light emitting layer 212 is disposed in the plurality of openings of the pixel defining layer 146. The fourth electrode structure 211 is disposed on the a of the second light emitting layer 212 away from the base substrate 14 and a side of the pixel defining layer 146 away from the base substrate 14.

For example, in some embodiments, a transition layer (not shown in the figure) may also be provided between the source electrode 223 and the third electrode structure 211, and the transition layer may be provided in the same layer as the transparent wiring layer 153.

For example, as shown in FIGS. 4, 5, 6A and 6B, FIG. 8C and FIG. 8D, and FIG. 12, each of the plurality of second pixel units C in the third display region 30 of the display substrate includes a fourth light emitting element 31 and a fourth pixel circuit. The fourth pixel circuit is electrically connected to the fourth light emitting element 31 to drive the fourth light emitting element. The fourth light emitting element 31 includes a fifth electrode structure 311, a sixth electrode structure 313, and a third light emitting layer 312 between the fifth electrode structure 311 and the sixth electrode structure 313, the fifth electrode structure 311 is electrically connected to the third pixel circuit through via hole. For example, the fifth electrode structure 311 is the anode structure of the fourth light emitting element 31, and the sixth electrode structure 313 is the cathode structure of the fourth light emitting element 31. For example, the fifth electrode structure 311 may include a plurality of electrode sub-layers, for example, a three-layer structure of ITO/Ag/ITO (not shown in the figure), etc. The specific form of the fifth electrode structure 311 is not limited in the embodiment of the present disclosure.

For example, the fourth pixel circuit includes structures such as a thin film transistor 32 and a storage capacitance 33. For example, the thin film transistor 32 includes an active layer 331, a gate electrode 332, a first gate insulating layer 141, a second gate insulating layer 142, an interlayer insulating layer 143, source and drain electrodes (ie, source electrode 323 and drain electrode 324), a first transfer electrode 315, a light emitting element 31, and a pixel defining layer 146 and other structures, and the storage capacitance 33 includes a first capacitance plate 331 and a second capacitance plate 332.

For example, the active layer 321 is disposed on the base substrate 14, the first gate insulating layer 141 is disposed on a side of the active layer 321 away from the base substrate 14, and the gate electrode 322 and the first capacitance plate 331 are disposed in a same layer on a side of the first gate insulating layer 141 away from the base substrate 14, the second gate insulating layer 142 is disposed on a side of the gate electrode 322 away from the base substrate 14 and a side of the first capacitance plate 331 away from the base substrate 14, the second capacitance plate 332 is disposed on a side of the second gate insulating layer 142 away from the base substrate 14, the interlayer insulating layer 143 is disposed on a side of the second capacitance 332 away from the base substrate 14, the source and drain electrodes are disposed on a side of the interlayer insulating layer away from the base substrate 14, and are electrically connected to the active layer 321 through the via holes in the first gate insulating layer 141, the second gate insulating layer 142, and the interlayer insulating layer 143. A first planarization layer 144 is disposed on a side of the source and drain electrodes away from the base substrate 14, and the first planarization layer 144 provides a first planarization surface to planarize the forth pixel circuit.

For example, the first via hole 144A is provided in the first planarization layer 144, and the first transfer electrode 315 is disposed on a side of the first planarization layer away from the base substrate 14 and is electrically connected to the source electrode 223 of the source and drain electrodes through the first via hole 144A. The second planarization layer 145 is disposed on a side of the first transfer electrode 215 away from the base substrate 14 and provides a second planarization surface, the second via hole 145A is provided in the second planarization layer 145.

For example, the fifth electrode structure 311 is electrically connected to the first transfer electrode 315 through the second via hole 145A in the second planarization layer 145. The pixel defining layer 146 is disposed on a side of the first anode structure 311 away from the base substrate 14 and includes a plurality of openings. The third light emitting layer 312 is disposed in the plurality of openings of the pixel defining layer 146. The sixth electrode structure 211 is disposed on a side of a third light emitting layer 212 away from the base substrate 14 and a side of the pixel defining layer 146 away from the base substrate 14.

For example, in some embodiments, a transition layer (not shown in the figure) may also be provided between the source electrode 323 and the second anode structure 311, and the transition layer may be provided in a same layer as the transparent wiring layer 153.

For example, the first pixel circuit, the second pixel circuit, and the third pixel circuit in the second display region 20 have the same structure as the fourth pixel circuit in the third display region 30, so the first pixel circuit, the second pixel circuit, the third pixel circuit and the fourth pixel circuit may be formed by the same patterning process in the preparation process. For example, the first gate insulating layer 141 in the second display region 20, the second gate insulating layer 142 in the second display region 20, the interlayer insulating layer 143 in the second display region 20, and the first planarization layer 144 in the second display region 20 are respectively disposed in the same layer as the first gate insulating layer 141 in the third display region 30, the second gate insulating layer 142 in the third display region 30, the interlayer insulating layer 143 in the third display region 30, and the first planarization layer 144 in the third display region 30, in some embodiments, these layers in the second display region 20 and these layers in the third display region 30 may be integrated, such as the same insulating layer, so these layers in the second display region 20 and these layers in the third display region 30 are given the same reference numerals in the figures.

For example, in some embodiments, as shown in FIG. 7, the first display region 10 further includes a transparent support layer 191 on the base substrate 14, and the light emitting element 11 is disposed on a side of the transparent support layer 191 away from the base substrate 14. Thus, with respect to the base substrate 14, the light emitting element 11 in the first display region 10 can be located at basically the same height as the third light emitting element 21 in the second display region 20 and the fourth light emitting element 31 in the third display region 30, so that the display effect of the display substrate can be improved.

For example, the transparent support layer 191 is disposed in a same layer as at least one of the first gate insulating layer 141, the second gate insulating layer 142, the interlayer insulating layer 143, and the first planarization layer 144. For example, the transparent support layer 191 is disposed in the same layer as the first gate insulating layer 141, the second gate insulating layer 142, the interlayer insulating layer 143, and the first planarization layer 144, so that the light emitting element 11 in the first display region 10 can be located at basically the same height as the third light emitting element 21 in the second display region 20 and the fourth light emitting element 31 in the third display region 30, and the manufacturing process of the display substrate is simplified.

Figure 11:
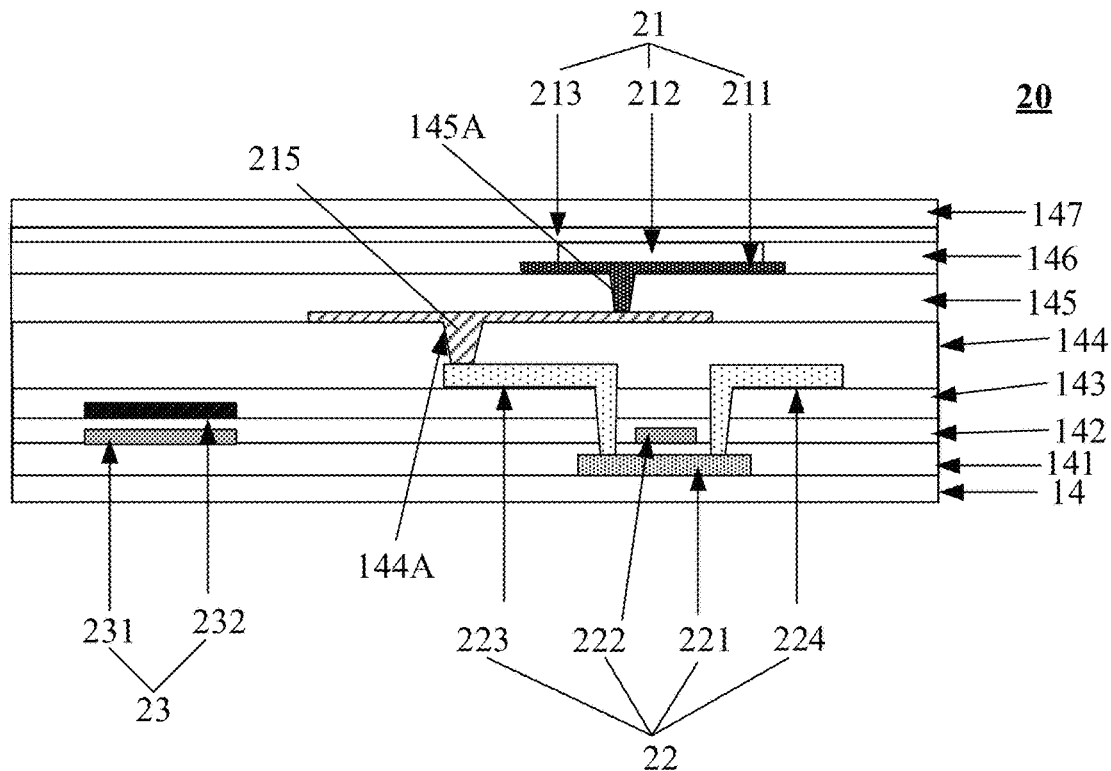
FIG. 11 is a schematic cross-sectional view of a second display region in a display substrate provided by at least one embodiment of the present disclosure.
Figure 12:
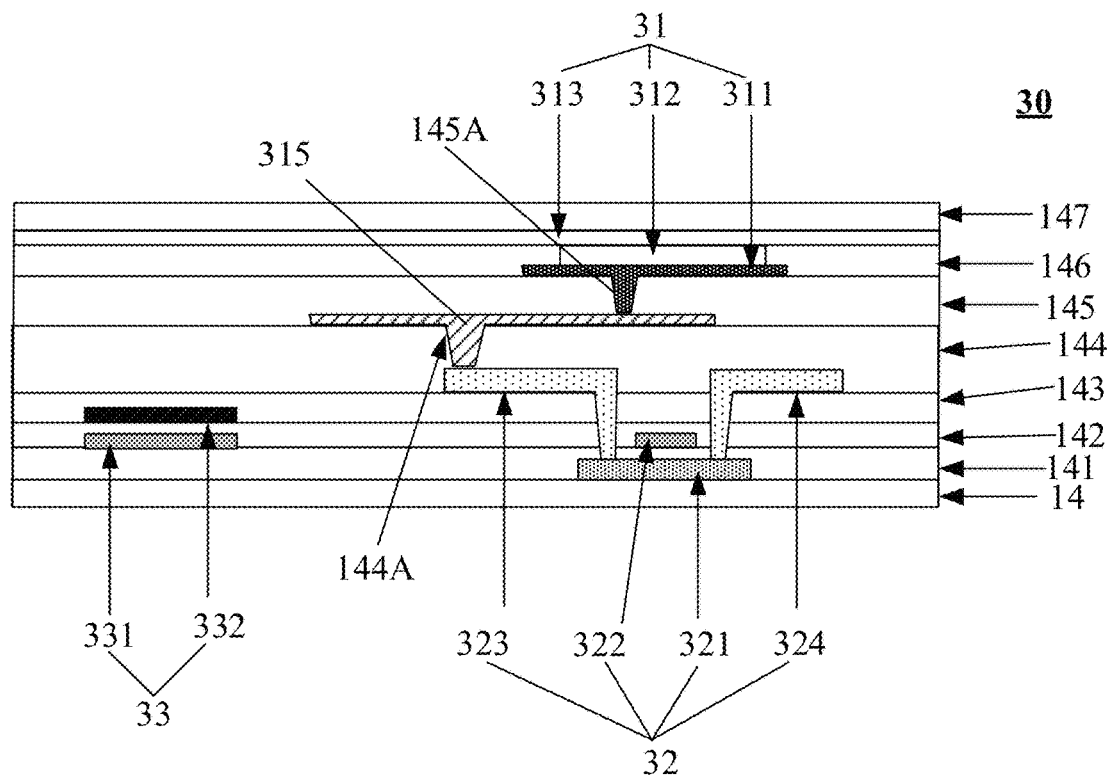
FIG. 12 is a schematic cross-sectional view of a third display region in a display substrate provided by at least one embodiment of the present disclosure.

For example, as shown in FIGS. 7, 11 and 12, the display substrate further includes a pixel defining layer 146 and an encapsulating layer 147. For example, the pixel defining layer 146 is disposed on the first electrode structure 111 or the third electrode structure 211 or the fifth electrode structure 311 and the pixel defining layer 146 includes a plurality of openings, the first light emitting layer 112 or the second light emitting layer 212 or the third light emitting layer 312 is formed in the openings of the pixel defining layer 146. For example, the encapsulating layer 147 may include a single-layer or multi-layer encapsulating structure, and the multi-layer encapsulating structure includes, for example, a stack of an inorganic encapsulation layer and an organic encapsulation layer, thereby improving the encapsulation effect on the display substrate.

For example, the pixel defining layer 146 in the first display region 10, the pixel defining layer 146 in second display region 20 and the pixel defining layer 146 in the third display region 30 are disposed in a same layer, and are integrated in some embodiments, the encapsulating layer 147 in the first display region 10, the encapsulating layer 147 in second display region 20 and the encapsulating layer 147 in the third display region 30 are disposed in a same layer, and are integrated in some embodiments, so they are given the same reference numerals in the figures.

For example, in various embodiments of the present disclosure, the base substrate 14 may be a glass substrate, a quartz substrate, a metal substrate, or a resin substrate. The embodiments of the present disclosure is not limited thereto.

For example, the first gate insulating layer 141, the second gate insulating layer 142, the interlayer insulating layer 143 and the planarization layer 144, the insulating layer 145, the pixel defining layer 146, the encapsulating layer 147, and the insulating layer 148 may include inorganic insulating materials such as silicon oxide, silicon nitride, silicon oxynitride or may include organic insulating materials such as polyimide, polyphthalimide, polyphthalamide, acrylic resin, benzocyclobutene or phenolic resin. The embodiments of the present disclosure do not specifically limit the materials of the above-mentioned functional layers.

For example, the material of the active layer may include semiconductor materials such as polysilicon or oxide semiconductor (for example, indium gallium zinc oxide). For example, the part of the active layer 121/221/321 can be made into a conductor through conduction treatment such as doping, so as to have higher conductivity.

For example, the materials of the gate electrode, the first capacitance plate, and the second capacitance plate may include metal materials or alloy materials, such as molybdenum, aluminum, and titanium.

For example, the material of the source and drain electrodes may include metal materials or alloy materials, such as a metal single-layer or metal multi-layer structure formed of molybdenum, aluminum, titanium, etc., for example, the metal multi-layer structure is a laminated structure of multiple metal layers, for example, a laminated structure of three metal layers of titanium, aluminum, and titanium (Ti/Al/Ti), etc.

For example, the display substrate provided by the embodiment of the present disclosure may be a display substrate such as an organic light emitting diode (OLED) display substrate or a quantum dot light emitting diode (QLED) display substrate, and the embodiment of the present disclosure does not limit the specific type of the display substrate.

For example, in the case that the display substrate is an organic light emitting diode display substrate, the first light emitting layer 112/the second light emitting layer 212/the third light emitting layer 312 may include small molecular organic materials or polymer molecular organic materials, the first light emitting layer 112/the second light emitting layer 212/the third light emitting layer 312 may be fluorescent materials or phosphorescent materials, the first light emitting layer 112/the second light emitting layer 212/the third light emitting layer 312 may emit red light, green light, blue light, or white light. Moreover, according to actual needs, in different examples, the first light emitting layer 112/the second light emitting layer 212/the third light emitting layer 312 may further include an electron injection layer, an electron transport layer, a hole injection layer, and a hole transport layer and other functional layers.

For example, in the case that the display substrate is a quantum dot light emitting diode (QLED) display substrate, the first light emitting layer 112/the second light emitting layer 212/the third light emitting layer 312 may include quantum dot materials, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots and indium arsenide quantum dots, etc., the particle size of the quantum dot is 2-20 nm.

For example, in the embodiment of the present disclosure, the first display region 10 may have various shapes such as a circle (the situation shown in FIG. 3), a rectangle, a triangle, etc. The embodiment of the present disclosure does not limit the shape of the first display region 10.

For example, in some embodiments, as shown in FIG. 3A and FIG. 7, the display substrate may further include a sensor 192, such as an image sensor, an infrared sensor, a distance sensor, etc., for example, the sensor 192 may be implemented in the form of a chip or the like. The sensor 192 is provided on the non-display side (the side facing away from the user) of the display substrate. The sensor 192 and the first display region 10 at least partially overlap in the normal direction of the display surface of the display substrate.

For example, the sensor 192 may be an image sensor, and may be used to collect images of the external environment facing the light collecting surface of the sensor 192, for example, the sensor 192 may be a CMOS image sensor or a CCD image sensor, the sensor 192 may also be an infrared sensor or a distance sensor, etc. The sensor 192 can be used to implement a camera of a mobile terminal such as a mobile phone and a notebook, and may also include optical devices such as a lens, a mirror, or an optical waveguide as required to modulate the optical path. The embodiment of the present disclosure does not limit the type, function, and setting method of the sensor 192.

The sensor 192 is arranged on the non-display side of the display panel by means of double-sided tape, and the orthographic projection of the sensor 192 on the base substrate 14 at least partially overlaps the first display region 10, and the sensor 192 is configured to receive light from the first side. Thus, the first display region 10 provides convenience for the setting of the sensor 192 while achieving display.

At least one embodiment of the present disclosure also provides a display device, the display device includes any one of the above-mentioned display substrates. The display device can be implemented as any product or component with display function such as a mobile phone, a tablet computer, a television, a monitor, a notebook computer, a digital photo frame, and a navigator, etc.

For the present disclosure, the following statements should be noted:
(1) The accompanying drawings involve only the structure(s) in connection with the embodiment(s) of the present disclosure, and other structure(s) can be referred to common design(s).
(2) In case of no conflict, embodiments of the present disclosure and features in the embodiments can be combined to obtain new embodiments.

The above are only specific implementations of the present disclosure, but the protection scope of the present disclosure is not limited thereto. Variants and replacements that can be easily conceived by one of ordinary skill in the art within the technical scope disclosed in the present disclosure shall be covered by the protection scope of the present disclosure. Therefore, the protection scope of the present disclosure should be subject to the protection scope of the claims.

What is claimed is:

1. A display substrate, comprising:
a display region, wherein the display region comprises a first display region and a second display region at least partially surrounding the first display region,
the first display region comprises a plurality of light emitting elements arranged in an array, the plurality of light emitting elements comprise a first light emitting element and a second light emitting element, the second display region comprises a plurality of first pixel circuit units, and the plurality of first pixel circuit units comprise a first pixel circuit and a second pixel circuit,
a first connection line, connecting the first pixel circuit and the first light emitting element, wherein the first pixel circuit is configured to drive the first light emitting element through the first connection line; and
a second connection line, connecting the second pixel circuit and the second light emitting element, wherein the second pixel circuit is configured to drive the second light emitting element through the second connection line,
wherein, the second connection line extends in a first direction, the first connection line extends in a second direction, and the first direction and the second direction cross each other,
at least one of the first connection line and the second connection line comprises a first part located in the first display region and a second part located in the second display region, and the first part and the second part are electrically connected to each other,
the first part comprises a first light transmitting wiring layer made of transparent conductive material, and the second part comprises a metal wiring layer made of metal material.

2. The display substrate according to claim 1, further comprising:
a first signal line and a second signal line,
the first signal line comprises a first main portion and a first winding portion, the first main portion extends in the first direction, and at least part of the first winding portion extends in a direction crossing the first direction;
the second signal line comprises a second main portion, and the second main portion extends in the second direction;
the first winding portion of the first signal line and the second main portion of the second signal line are electrically connected to the first pixel circuit, so as to respectively provide a first driving signal and a second drive signal to the first pixel circuit; and
an extension line of the first main portion and an extension line of the second main portion intersect in the first display region.

3. The display substrate according to claim 2, wherein the first winding portion comprises a first sub-winding portion, a second sub-winding portion, and a third sub-winding portion, the first sub-winding portion extends in the second direction, the second sub-winding portion extends in the first direction, and the third sub-winding portion connects the first sub-winding portion and the first main portion,
wherein the first sub-winding portion is electrically connected to the second sub-winding portion and the third sub-winding portion by a wire jumper method, and the second sub-winding portion is electrically connected to the first pixel circuit.

4. The display substrate according to claim 3, wherein the third sub-winding portion at least partially surrounds the first display region, and the third sub-winding portion overlaps with the first connection line.

5. The display substrate according to claim 2, wherein the first main portion and at least part of the first winding portion are disposed in different wiring layers.

6. The display substrate according to claim 2, wherein the second signal line further comprises a second winding portion, and at least part of the second winding portion extends in a direction crossing the second direction.

7. The display substrate according to claim 6, wherein the second main portion and at least part of the second winding portion are disposed in different wiring layers.

8. The display substrate according to claim 6, further comprising a third signal line,
wherein the third signal line comprises a third main portion and a third winding portion, the third main portion extends in the first direction, and at least part of the third winding portion extends in the direction crossing the first direction; and
the third winding portion of the third signal line and the second winding portion of the second signal line are electrically connected to the second pixel circuit, so as to respectively provide a third drive signal and the second drive signal for the second pixel circuit.

9. The display substrate according to claim 8, wherein the third winding portion comprises a fourth sub-winding portion, a fifth-sub winding portion, and a sixth sub-winding portion, the fourth sub-winding portion extends in the second direction, and the fifth sub-winding portion extends in the first direction, the sixth sub-winding portion connects the fourth sub-winding portion and the third main portion,
wherein the fourth sub-winding portion is electrically connected to the fifth sub-winding portion and the sixth sub-winding portion by a wire jumper method, and the fifth sub-winding portion is electrically connected to the second pixel circuit.

10. The display substrate according to claim 8, wherein the first signal line and the third signal line are data lines, the first driving signal and the third driving signal are data signals, the second signal line is a gate line, and the second driving signal is a gate scan signal.

11. The display substrate according to claim 1, wherein the first connection line and the second connection line are transparent lines.

12. The display substrate according to claim 8, wherein the first winding portion of the first signal line and the third winding portion of the third signal line are routed around an edge of the first display region at a boundary between the first pixel circuit units of the second display region and the light emitting elements of the first display region.

13. The display substrate according to claim 1, wherein the second display region further comprises a plurality of first pixel units, and the plurality of first pixel units and the plurality of first pixel circuit units are alternately arranged.

14. The display substrate according to claim 13, wherein each of the plurality of first pixel units comprises a third light emitting element and a third pixel circuit, and the third pixel circuit is electrically connected to the third light emitting element so as to drive the third light emitting element.

15. The display substrate according to claim 8, wherein the display region further comprises a third display region, the third display region comprises a plurality of second pixel units,
each of the plurality of second pixel units comprises a fourth light emitting element and a fourth pixel circuit,
wherein the first main portion of the first signal line extends in the third display region to be electrically connected to the fourth pixel circuit located in the first direction with respect to the first light emitting element, and the third main portion of the third signal line extends in the third display region to be electrically connected to the fourth pixel circuit located in the first direction with respect to the second light emitting element.

16. The display substrate according to claim 15, wherein the fourth pixel circuit is electrically connected to the fourth light emitting element so as to drive the fourth light emitting element.

17. The display substrate according to claim 8, wherein the first pixel circuit and the second pixel circuit respectively comprise a thin film transistor and a storage capacitance, the thin film transistor comprises an active layer, a gate electrode, a first gate insulating layer, a second gate insulating layer, an interlayer insulating layer, and source and drain electrodes, and the storage capacitance comprises a first capacitance plate and a second capacitance plate;

the active layer is disposed on the base substrate, the first gate insulating layer is disposed on a side of the active layer away from the base substrate, and the gate electrode and the first capacitance plate are disposed in a same layer on a side of the first gate insulating layer away from the base substrate, and the second gate insulating layer is disposed on a side of the gate electrode away from the base substrate and a side of the first capacitance plate away from the base substrate,
the second capacitance plate is disposed on a side of the second gate insulating layer away from the base substrate, and the interlayer insulating layer is disposed on a side of the second capacitance plate away from the base substrate,
the source and drain electrodes are disposed on a side of the interlayer insulating layer away from the base substrate, and the source and drain electrodes are electrically connected to the active layer through via holes in the first gate insulating layer, the second gate insulating layer, and the interlayer insulating layer,
the display substrate further comprises a first planarization layer disposed on a side of the source and drain electrodes away from the base substrate to provide a first planarization surface, the first planarization layer comprises first via holes,
wherein the second signal line is disposed in a same layer as the gate electrode and the first capacitance plate,
the first signal line and the third signal line are disposed in a same layer as the source and drain electrodes.

18. The display substrate according to claim 17, wherein the first connection line and the second connection line respectively comprise a light transmitting wiring layer, and the light transmitting wiring layer is on the first planarization surface and located in the first display region and the second display region, the light transmitting wiring layer is electrically connected to the thin film transistor through the first via holes of the first planarization layer in the second display region,
the display substrate further comprises a second planarization layer disposed on a side of the light transmitting wiring layer away from the base substrate to provide a second planarization surface, and the second planarization layer comprises second via holes located in the first display region,
the first light emitting element in the first display region and the second light emitting element in the first display region are on the second planarization surface and are electrically connected to the light transmitting wiring layer in the first display region through the second via holes.

19. A display device, comprising:
a display substrate according to claim 1; and
a sensor, disposed at a non-display side of the display substrate,
wherein an orthographic projection of the sensor on the base substrate is at least partially overlapped with the first display region.

* * * * *